United States Patent
Koller et al.

(10) Patent No.: US 11,784,143 B2
(45) Date of Patent: Oct. 10, 2023

(54) SINGLE METAL CAVITY ANTENNA IN PACKAGE CONNECTED TO AN INTEGRATED TRANSCEIVER FRONT-END

(71) Applicant: Intel Corporation, Santa Clara, CA (US)

(72) Inventors: Sonja Koller, Lappersdorf (DE); Kilian Roth, Munich (DE); Josef Hagn, Taufkirchen (DE); Andreas Wolter, Regensburg (DE); Andreas Augustin, Munich (DE)

(73) Assignee: Intel Corporation, Santa Clara, CA (US)

( * ) Notice: Subject to any disclaimer, the term of this patent is extended or adjusted under 35 U.S.C. 154(b) by 960 days.

(21) Appl. No.: 16/421,315

(22) Filed: May 23, 2019

(65) Prior Publication Data

US 2020/0373259 A1   Nov. 26, 2020

(51) Int. Cl.
| | |
|---|---|
| H01L 23/66 | (2006.01) |
| H01L 23/31 | (2006.01) |
| H01L 23/538 | (2006.01) |
| H01L 23/552 | (2006.01) |
| H01L 21/48 | (2006.01) |
| H01P 3/00 | (2006.01) |
| H01P 11/00 | (2006.01) |

(Continued)

(52) U.S. Cl.
CPC .......... *H01L 23/66* (2013.01); *H01L 21/4853* (2013.01); *H01L 21/565* (2013.01); *H01L 23/315* (2013.01); *H01L 23/3128* (2013.01); *H01L 23/5389* (2013.01); *H01L 23/552* (2013.01); *H01P 3/003* (2013.01); *H01P 11/001* (2013.01); *H01Q 1/2283* (2013.01); *H01L 2223/6627* (2013.01); *H01L 2223/6638* (2013.01); *H01L 2223/6677* (2013.01)

(58) Field of Classification Search
None
See application file for complete search history.

(56) References Cited

U.S. PATENT DOCUMENTS

| | | | | |
|---|---|---|---|---|
| 2009/0256752 | A1* | 10/2009 | Akkermans | .......... H01Q 1/2283 |
| | | | | 343/700 MS |
| 2016/0049723 | A1* | 2/2016 | Baks | ..................... H01Q 9/0457 |
| | | | | 343/848 |
| 2019/0027449 | A1* | 1/2019 | Wan | ....................... H01L 23/481 |

* cited by examiner

*Primary Examiner* — Jay C Chang
(74) *Attorney, Agent, or Firm* — Schwabe, Williamson & Wyatt, P.C.

(57) ABSTRACT

Embodiments include semiconductor packages and methods of forming the semiconductor packages. A semiconductor package includes a die over a substrate, a first conductive layer over the die, and a conductive cavity antenna over the first conductive layer and substrate. The conductive cavity antenna includes a conductive cavity, a cavity region, and a plurality of interconnects. The conductive cavity is over the first conductive layer and surrounds the cavity region. The semiconductor package also includes a second conductive layer over the conductive cavity antenna, first conductive layer, and substrate. The conductive cavity extends vertically from the first conductive layer to the second conductive layer. The cavity region may be embedded with the conductive cavity, the first conductive layer, and the second conductive layer. The plurality of interconnects may include first, second, and third interconnects. The first interconnects may include through-mold vias (TMVs), through-silicon vias (TSVs), conductive sidewalls, or conductive trenches.

15 Claims, 8 Drawing Sheets

(51) Int. Cl.
*H01Q 1/22* (2006.01)
*H01L 21/56* (2006.01)

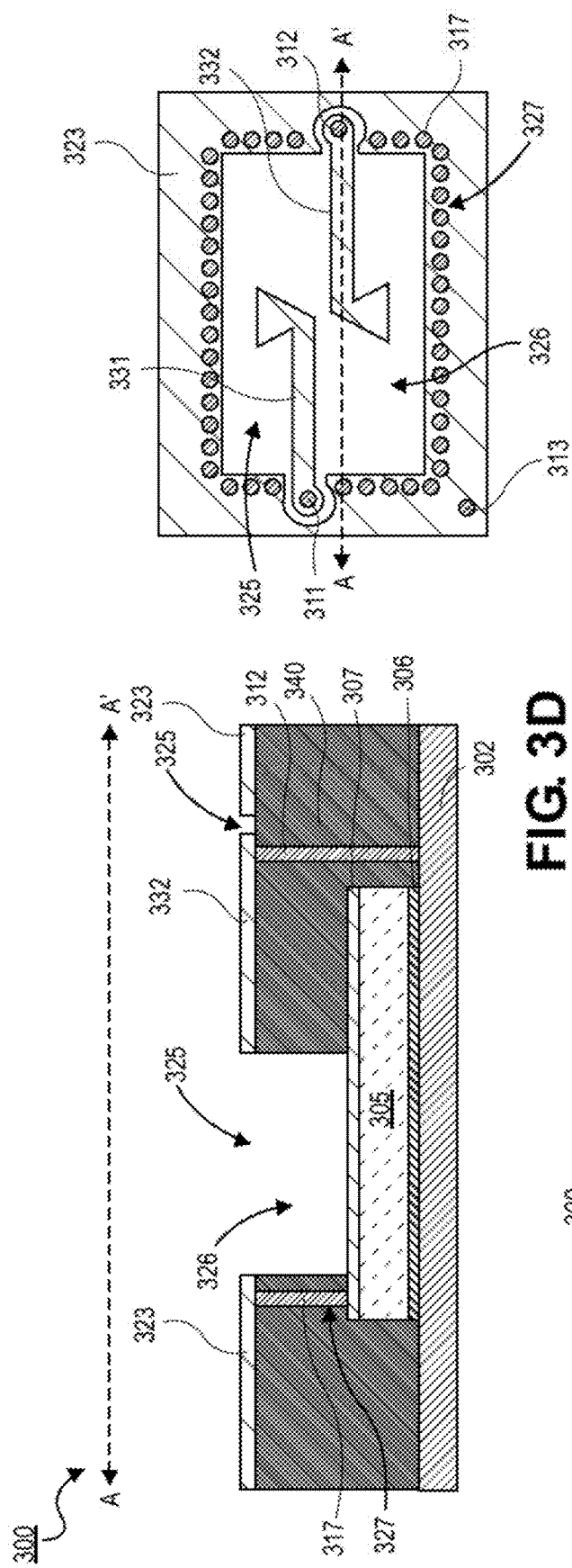
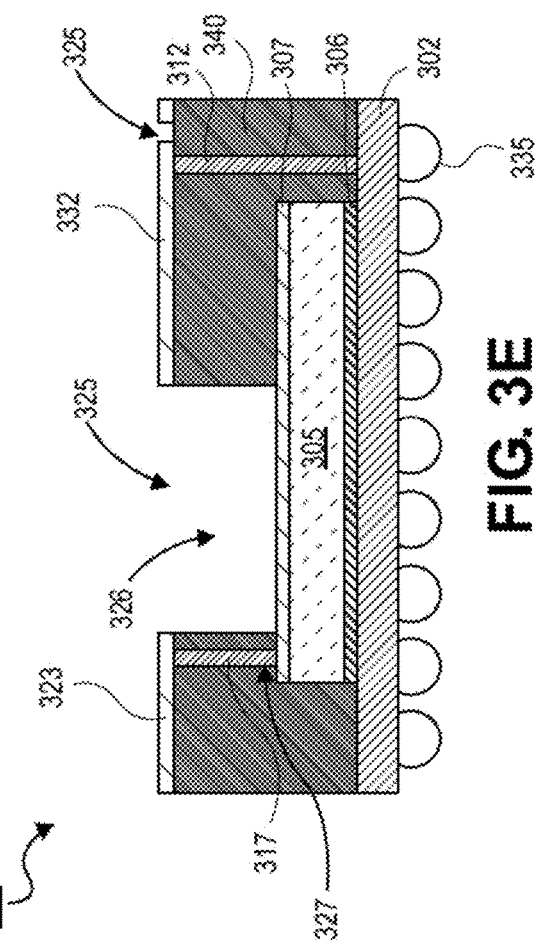
FIG. 3D
FIG. 3E

SINGLE METAL CAVITY ANTENNA IN PACKAGE CONNECTED TO AN INTEGRATED TRANSCEIVER FRONT-END

FIELD

Embodiments relate to packaging semiconductor devices. More particularly, the embodiments relate to semiconductor devices with conductive cavity antennas integrated with transceiver front-end layers.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down these ICs while optimizing the performance of each device, however, is not without issue.

As the number of antennas in mobile phones, supported communication bands, and data throughput for wireless and communication applications increase, existing packaging technologies need antenna solutions to save space and substantially increase efficiency and communication performances. Also, as 5G wireless communication technologies continue to quickly expand, additional antenna arrays are required to implement and support the operations for additional frequencies (e.g., millimeter-waveguide frequency bands) and/or features like proximity sensing.

Current antennas in mobile phones are mainly implemented as patch antennas on printed circuit boards (PCBs). These antennas generally require longer connections between the transceiver front-ends and such antennas. This substantially increases the communication losses of wireless devices as the carrier frequency of such communications is scaled, which thereby results in reduced efficiency and increased losses as the carrier frequency increases. Furthermore, these existing patch antennas increase the overall footprint and/or z-height of the PCBs and the respective devices.

BRIEF DESCRIPTION OF THE DRAWINGS

Embodiments described herein are illustrated by way of example and not limitation in the figures of the accompanying drawings, in which like references indicate similar features. Furthermore, some conventional details have been omitted so as not to obscure from the inventive concepts described herein.

FIGS. 3A-3E are illustrations of cross-sectional views and respective plan views of a process flow to form a semiconductor package having a conductive cavity antenna, an encapsulation layer, a first conductive layer, a second conductive layer, and a substrate, according to some embodiments.

DETAILED DESCRIPTION

Figure 1:
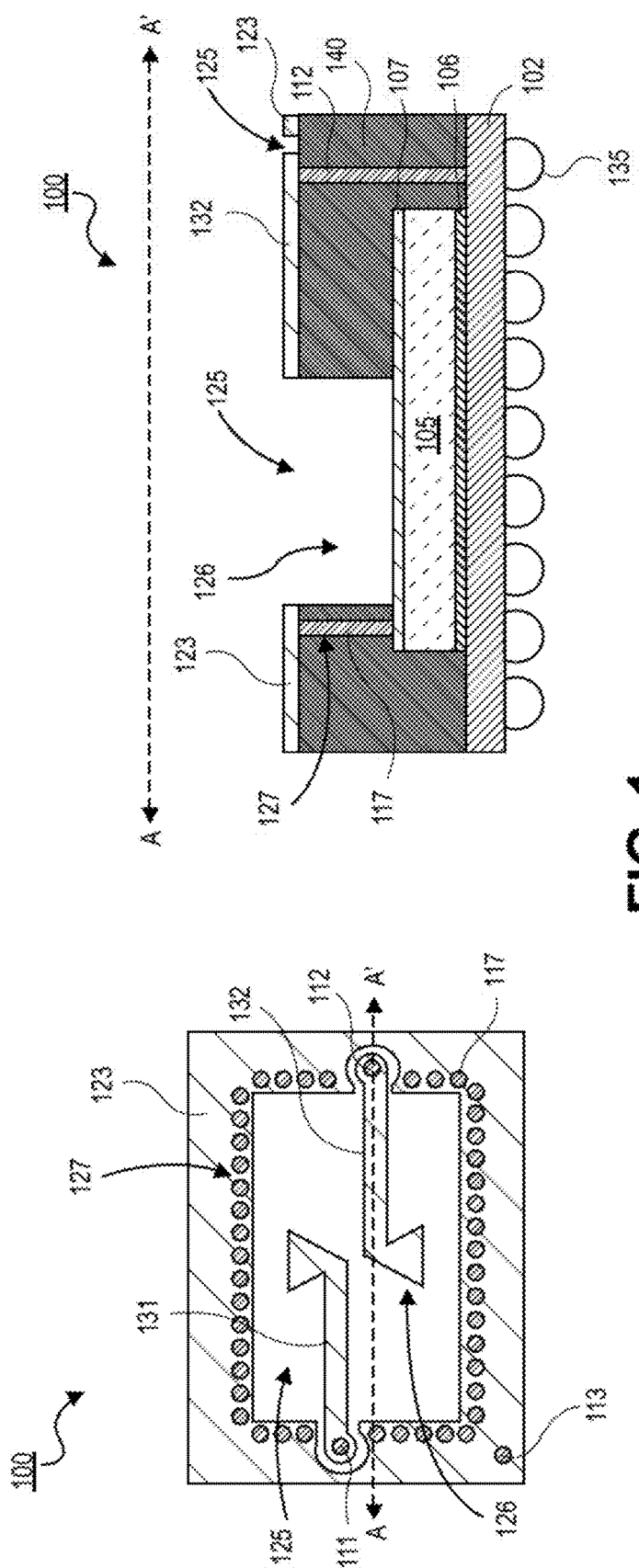
FIG. 1 are illustrations of a cross-sectional view and the respective plan view of a semiconductor package having a conductive cavity antenna, an encapsulation layer, a first conductive layer, a second conductive layer, and a substrate, according to one embodiment.

Described herein are semiconductor packages with conductive cavity antennas and methods of forming such semiconductor packages. The semiconductor packages described below and methods of forming such semiconductor packages (e.g., wafer level chip scale packages (WLCSPs), flip-chip package (FCPs), etc.) having a substrate with a die, an encapsulation layer (or a dielectric layer, a mold layer, etc.), and a conductive cavity antenna (e.g., a differential-fed conductive cavity antenna or the like), in some embodiments. Furthermore, the semiconductor packages described herein may enable integrating (or implementing) differential conductive cavity antennas with transceiver front-end active layers, according to one embodiment.

As described herein, a "conductive cavity antenna" (or a differential conductive cavity antenna) may refer to an antenna having a conductive cavity (or a conductive ring), a cavity region, and a plurality of interconnects that is disposed over a conductive layer (or a first conductive layer) of a transceiver semiconductor package (e.g., a WLCSP, a FCP, or the like), where the antenna has connection points (or differential feedline connection points, planar conductive antenna signal structures, etc.) disposed over the cavity region of the conductive cavity, and where the antenna is disposed on the backside of an active layer (or a transceiver front-end layer) of such package. These conductive cavity antennas described herein may be implemented with a dielectric layer (e.g., a bulk silicon layer, a filler layer, etc.), an encapsulation layer (e.g., a mold layer), or the like.

Additionally, as described herein, a "conductive cavity" may refer to a conductive enclosure (or a metallized enclosure/cage/box/etc.) having a top wall, a bottom wall, and a plurality of sidewalls, where the bottom wall may include a surface of the conductive layer, where the top wall may include a surface of another conductive layer (e.g., a plurality of conductive connection points), and where the plurality of sidewalls may include a plurality of first interconnects (e.g., the first interconnects of the sidewalls may include a plurality of through-mold vias (TMVs), a plurality of through-silicon vias (TSVs), a plurality of conductive sidewalls, a plurality of conductive trenches, and/or a combination thereof). The conductive cavity may be filled (or disposed) with an encapsulation layer, a dielectric layer, and/or air in the cavity. The conductive cavity described herein does not have to be a fully enclosed enclosure and may be an open-ended enclosure with one or more open/exposed walls or sides. The cavity region described herein may refer to an area (or a footprint) around/below the connection points (or signal structures) of the antenna. Additionally, the cavity region may be filled (completely or partially) with, but is not limited to, a material with a lower dielectric constant such as air or the like.

Note that, in some embodiments, when the antenna signal structures are implemented over a package material that is also a dielectric material (e.g., an encapsulation/mold material), the conductive cavity antennas described herein may be implemented without an enclosed conductive cavity (i.e., the enclosed conductive cavity may be substantially enclosed with each of the cavity walls, such as a top wall, a bottom wall, and four sidewalls), for example, as long as at least one conductive layer/plane is disposed below the antenna signal structures (i) to avoid coupling the antenna to other package structures, and (ii) to direct the signal emission towards the topside. For example, this may be implemented with antenna signal structures disposed around and/or over an open cavity region, where such region includes a conductive layer as the metallized bottom-side wall and a plurality of TMVs (or TSVs) as the metallized sidewalls. Accordingly, the conductive cavities described herein may include enclosed cavity regions or open cavity regions such as open-ended enclosures with one or more walls/sides that are exposed/open.

As described above, existing packaging solutions encounter several problems due to the ever-increasing number of supported frequency bands and antennas in mobile devices, the heightened communication losses between the antennas and the integrated circuits (ICs), and the shrinking available space on such devices. To overcome these problems (and many other problems) and provide improvements in these environments (or other related environments), the semiconductor packages described herein enable integrated conductive cavity antennas to reduce space consumption, and improve efficiency as the distances (or losses) between the antenna signal structures and the transceiver front-end active layers are substantially minimized. The advantages of the embodiments described herein also include decoupling the conductive cavity antennas from the active layer of the semiconductor packages to reduce distortion of the signal and back coupling in the active layer (e.g., to avoid oscillation of the power amplifier (PA)), and enabling the metallization of the feedline (or radiation) patterns of such connection points (or antenna signal structures) to be patterned with different shapes to satisfy (or fit) the requirements of the desired applications.

Other advantages of the embodiments of the integrated conductive cavity antennas include:

(i) Implementing such antennas with the ever-shrinking sensors (e.g., proximity sensors) and mobile devices that are severely limited in package/board space. For example, due to the high power density of the transmission with larger antenna arrays at mm-waveguides, sensing the proximity of human body parts (or other objects) is necessary and thus reducing the transmitting power when such sensors are triggered is also vital. With such procedures, the skin tissue heating above the defined requirement may be prevented with these proximity sensors. Such sensors may be implemented (or formed) with additional antennas (e.g., similar to antennas used to obtain short-range distance measurements in cars), which may also lead to mobile devices (or other receivers) needing additional antennas. Accordingly, as the space available for such functionalities is severely limited, these sensors and mobile devices require implementing additional antennas such as the cavity resonator antennas described below in FIGS. 1-2, which avoid increasing the overall form-factor of such packages and adding problems and/or design complexities.

(ii) Enabling devices with future highly integrated terahertz applications (e.g., in the range of approximately 0.1 to 0.3 THz) to include even-more antennas on a single package. Dependent on the frequency range and the desired antenna pattern, future applications/devices may even integrate an antenna array on the package. For example, the wavelength at 60 GHz is roughly 5 mm. This may enable an antenna array with 4 antennas to be integrated with the package even with an area of approximately 5 mm×5 mm. Accordingly, as the wavelength scales linearly with the carrier frequency, future highly integrated terahertz applications (or the like) may integrate even-more antennas on semiconductor packages by using the conductive cavity antennas described below in FIGS. 1-2.

(iii) Mitigating signal losses as the distance of the feedlines are minimized. For example, existing technologies require (or desire) that the connection from the power amplifier to the antenna be as short as possible, especially given that, for a high frequency signal, relatively short connections already result in a major attenuation of the signal. Likewise, as every attenuation before the low-noise amplifier (LNA) typically has a direct impact on the noise figure of the overall receiver, this is also the case for the signal reception as the connection from the LNA to the antenna requires shorter distances. Accordingly, these signal losses may be substantially reduced (or mitigated) with the conductive cavity antennas described below in FIGS. 1-2 as the distance of the feed lines are minimized by disposing such antennas directly on the transceiver chip of the package chip.

(iv) Enabling differential feedlines (or similar antenna structures) to improve power performances as the output power of a single transistor is substantially limited, especially for complementary metal-oxide-semiconductor (CMOS) devices. For example, existing technologies typically require combining the output of multiple transistors to achieve sufficient signal power, however power combining is not ideal and losses occur. Accordingly, as the two differential feedlines may be implemented with distinct amplifiers, the conductive cavity antennas described below in FIGS. 1-2 do not require a power combiner as the power combining is implicitly performed by such antennas.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems (e.g., such systems also include base stations, routers, and so on), cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages (e.g., WLCSPs, FCPs, or the like) having substrates that are integrated with conductive cavity antennas.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1 is a cross-sectional view and the respective plan view of a semiconductor package 100 as illustrated on the A-A' axis, according to one embodiment. In some embodiments, FIG. 1 illustrates one of the approaches that enables integrating the conductive cavity antenna 125 with a plurality of connection points 131-132 (or differential feedline connection points) over a substrate 102 of the semiconductor package 100. Note that, as described herein, the conductive cavity antenna 125 may be referred to in-part (or interchangeably) as a single-metal cavity antenna, a differential-fed conductive cavity antenna, a conductive cavity/ring, a cavity antenna, a conductive antenna, a metallized enclosure/box/cage, or the like.

In these embodiments described below, the conductive cavity antenna 125 may include a conductive cavity 127, a cavity region 126, and a plurality of interconnects 111-113 and 117. For some embodiments, the conductive cavity antenna 125 may be implemented with a plurality of TMVs 117 (or a plurality of first interconnects, a TMV cage, etc.) that are tightly disposed on/over the outer periphery/edges of a first conductive layer 107 (or a die backside metallization layer) to form the one or more sidewalls of the conductive cavity 127. Additionally, as shown in FIG. 1, the first conductive layer 107 may be implemented as a bottom wall, and a second conductive layer 123 (or a conductive lid) may be implemented as a top wall (or as a portion of a top wall), where the combination of these walls (i.e., the sidewalls, the top wall, and the bottom wall) may respectively implement (or dispose/form) a conductive cavity 127 and a cavity region 126 of the conductive cavity antenna 125.

Note that, as described above, the sidewalls of the conductive cavity 127 may include TMV sidewalls, TSV sidewalls, conductive/metallized sidewalls, conductive/metallized trenches, and/or a combination thereof. In some embodiments, the conductive cavity antenna 125 may route a signal inside the conductive cavity 127 from the substrate 102 to a plurality of connection points 131-132 over the cavity region 126 using two signal TMVs 111-112, where the signal TMVs 111-112 are conductively coupled to the connection points 131-132 (i.e., the connection points 131-132 may be a feedline, an antenna element, a signal trace patterned into the second conductive layer 123, a coplanar waveguide based connector, and/or the like) that are disposed/patterned into the second conductive layer 123. Accordingly, in some embodiments, the conductive cavity antenna 125 may implement (i) the conductive cavity 127 with the TMVs 117 to substitute a cavity sidewall metallization (e.g., as shown with both views of FIG. 1), and (ii) the first conductive layer 107, as the die backside metallization, to provide the cavity bottom shielding (e.g., as shown with the cross-sectional view of FIG. 1).

Accordingly, as shown in FIG. 1, the first conductive layer 107 may provide the bottom wall, the TMVs 117 (or the plurality of first interconnects) may provide the sidewall(s), and a second conductive layer 123 may provide the top wall/edges as a ground layer (or a ground plane/lid), where the combination of these walls (i.e., the sidewalls, the top wall/edge, and the bottom wall) may respectively form the conductive cavity 127 that surrounds the cavity region 126 of the conductive cavity antenna 125. In these embodiments, the conductive cavity antenna 125 may also include a plurality of signal TMVs 111-112 (or a plurality of second interconnects) that route differential signals from the substrate 102 to a plurality of connection points 131-132, where the signal TMVs 111-112 are conductively coupled to the connection points 131-132, respectively, as feedlines for the differential signals.

For some embodiments, the connection points 131-132 may be a plurality of differential feedline connection points, and/or a plurality of planar conductive antenna signal structures, where such connection points 131-132 (or antenna structures) may be disposed/patterned into the second conductive layer 123, where the connection points 131-132 may be isolated from the grounded portion(s) of the second conductive layer 123, and where the connection points 131-132 may be used to receive/emit signals such as mm-waveguide signals. Additionally, as shown with the cross-section view of FIG. 1, the signal TMVs 111-112 may extend vertically through an encapsulation layer 140 and from the substrate 102 to the topside of the connection points 131-132, where the encapsulation layer 140 may be a mold layer that serves as the mechanical carrier for the connection points 131-132. Note that, however, the encapsulation layer 140 may be disposed only below the connection points 131-132 within the cavity region 126, while the other portions of the cavity region 126 may remain open and filled with air (or the like) and may expose portions of the top surface of the first conductive layer 107, according to some embodiments.

Referring now to FIG. 1, a cross-sectional view and the respective plan view of a semiconductor package 100 is shown, in accordance with an embodiment. In one embodiment, the semiconductor package 100 may be a FCP, WLCSP, a wirebond encapsulated package, and/or the like. The semiconductor package 100 may include a conductive cavity antenna 125 that is disposed over a die 105, an active layer 106, and a substrate 102, thereby providing a shorter path/connection from the front-end of the semiconductor package 100 to the conductive cavity antenna 125 that leads to a substantially minimized loss on this connection.

For one embodiment, the substrate 102 may include, but is not limited to, a package substrate, a printed circuit board (PCB), and a motherboard. The substrate 102 may be a layer(s) of dielectric and/or conductive materials as is known in the art. In another embodiment, the substrate 102 may be a layer of dielectric material. In other embodiments, the substrate 102 may be a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 102 may also include one or more conductive layers that may include copper or metallic traces, lines, pads, vias, via pads, and/or planes.

In one embodiment, the active layer 106 may be disposed between the die 105 and the substrate 102, where the substrate 102 may be coupled to a plurality of solder balls 135 (or a plurality of conductive bumps, pads, studs/pillars, semi-balls, gullwings, etc.) that may be used to couple the substrate 102 to another substrate. The active layer 106 may be an active region, a redistribution layer comprised of conductive interconnects (or bumps), an active conductive layer, or the like. In an embodiment, the die 105 may be implemented as a transceiver front-end die. For some embodiments, the die 105 may be a microelectronic device, a semiconductor die, an integrated circuit (IC), a central processing unit (CPU), a microprocessor, a platform controller hub (PCH), a memory, and/or a field-programmable gate array (FPGA). Additionally, a first conductive layer 107 may be disposed on a top surface (or a backside) of the die 105. The first conductive layer 107 may be a die backside metallization layer. In an alternative embodiment, the first conductive layer 107 may be disposed over and substantially parallel to the die backside metallization layer, where the first conductive layer 107 may be separated from the die backside metallization layer by a mold or dielectric layer.

Furthermore, as shown in FIG. 1, an encapsulation layer 140 may be disposed (completely or partially) over and around the conductive cavity 127, the first conductive layer 107, the die 105, the active layer 106, and the substrate 102. The encapsulation layer 140 may surround (completely or partially) the conductive cavity 127 with the TMVs 117, the signal TMVs 111-112, and one or more ground TMVs 113 (or one or more third interconnects), where the cavity region 126 of the conductive cavity 127 may be filled (completely or partially) with the encapsulation layer 140 (i.e., the cavity region 126 may be filled completely or partially with a mold layer, a dielectric layer, air, and/or the like). In one embodiment, the encapsulation layer 140 may be a mold layer and/or any similar encapsulation/molding material(s). For one embodiment, the encapsulation layer 140 may include an epoxy (e.g., a soft epoxy, a stiff epoxy, opaque epoxy, etc.) with one or more filler materials. In alternate embodiments, one or more portions of the encapsulation layer 140 may be replaced with other dielectric material (i.e., the encapsulation layer 140 may be combined with other portions of dielectric material rather than a uniform layer of molding materials). In an embodiment, the encapsulation layer 140 may be compression molded, laminated, planarized, or the like. For example, the encapsulation layer 140 may have a top surface that is substantially coplanar to the top surfaces of the TMVs 117, the signal TMVs 111-112, and the ground TMV 113.

For one embodiment, the TMVs 117 and 111-113 may be copper interconnects, copper pillars, and/or any similar metallic/conductive via interconnects. In some embodiments, the TMVs 117 and 113 may be a plurality of ground TMVs, where each of these vias/interconnects may be grounded (i.e., these TMVs may be conductively coupled to a ground source such as the ground layer of the substrate 102). Whereas the TMVs 111-112 may be a plurality of signal TMVs, where each of these vias/interconnects may be used as feedlines to route differential signals to the connection points 131-132.

In one embodiment, the TMVs 117 may have a width (or a diameter) that is substantially equal to a width of the signal and ground TMVs 111-113. In alternate embodiments, the TMVs 117 may have a width (or a diameter) that is different than a width of the signal and ground TMVs 111-113. Additionally, for one embodiment, the signal TMVs 111-112 and the ground TMV 113 may have a thickness that is greater than a thickness of the TMVs 117 of the conductive cavity 127. As such, the TMVs 117 of the conductive cavity 127 may have a thickness that is substantially equal to a thickness of the cavity region 126 of the conductive cavity antenna 125. For example, in one embodiments, the TMVs 117 may have a thickness (or a z-height) of approximately 20 um to 0.5 mm, where the thickness of the TMVs 117 may be based on the desired mold thickness and bandwidth of the conductive cavity antenna 125. In another embodiment, the TMVs 117 may have a thickness of approximately 100 um to 5 mm.

In one embodiment, the sidewalls of the conductive cavity 127 (or the conductive cage) may be implemented with TMV sidewalls. While, in another embodiment, the sidewalls of the conductive cavity 127 may be implemented with a combination of TMV sidewalls, TSV sidewalls, and/or conductive walls/trenches. As shown with the illustrations of FIG. 1, when the sidewalls of the conductive cavity 127 are TMV sidewalls, each of the TMVs 117 may be tightly placed/located adjacent to each other and disposed on the top outer edges of the first conductive layer 107 to form the sidewalls of the conductive cavity 127 of the conductive cavity antenna 125. These tightly disposed TMVs 117 may have small gaps formed between the TMVs 117, where the small gaps may have a width that is substantially equal to a width of the TMVs 117. The small gaps may be filled with the encapsulation layer 140, where the encapsulation layer 140 is thus disposed between each pair of the TMVs 117.

Additionally, in one embodiment, the first conductive layer 107 may be implemented as the bottom wall of the conductive cavity antenna 125. In an embodiment, the second conductive layer 123 may be disposed over the encapsulation layer 140, the TMVs 117, and the signal and ground TMVs 111-113. The second conductive layer 123 may be a grounded layer (or a grounded plane/lid) by conductively coupling the second conductive layer 123 to the TMVs 117 of the conductive cavity 127 (or the ground ring) and the ground TMV 113.

In some embodiments, the conductive cavity 127 (or the conductive cavity) may surround the cavity region 126 of the conductive cavity antenna 125, where the cavity region 126 may have a specified dimension based on the desired packaging design and/or applications. The dimensions of the cavity region 126 of the conductive cavity antenna 125 may include a length in the lateral direction that may defined by half the wavelength of such antenna ($\lambda/2$), and a thickness (or a depth) in the z-height direction that may be approximately 100 µm or greater, where the thickness (or the cavity depth) may be limited by the bandwidth of such antenna. In other embodiments, the cavity region 126 may have a thickness of approximately 20-100 µm based on specified applications that may be operating at narrower bands (e.g., such specified (or alternate/special) applications may include proximity sensing). In one embodiment, the cavity region 126 may have a thickness of approximately 20 um to 0.5 mm, where the thickness of the cavity region 126 may be based on the desired mold thickness and bandwidth of the conductive cavity antenna 125. In another embodiment, the cavity region 126 may have a thickness of approximately 100 um to 5 mm.

Additionally, the cavity region 126 of the conductive cavity 127 may have a footprint defined by an x-y area of such cavity region 126 based on the desired wavelength(s) of the conductive cavity antenna 125. The cavity region 126 may have an antenna length (x) that may be approximately equal to half of the desired wavelength. The cavity region 126 of the conductive cavity 127 may have an antenna length (y) that may be approximately equal to or less than half of the desired wavelength. Note that the tolerance ranges of the footprint may vary by roughly +/−50%, but such footprint may be greater if desired. For example, for mobile packaging, the cavity region 126 of the conductive cavity 127 (or the TMV ring) may have a footprint (or an x-y) of approximately 0.2 mm to 1 cm. Whereas, for larger packages, the cavity region 126 of the conductive cavity 127 (or the TMV ring) may have a footprint (or an x-y) of approximately 0.2 mm to 10 cm, according to another embodiment.

As shown in the top view of FIG. 1, the second conductive layer 123 may be patterned over the encapsulation layer 140 and the cavity region 126 to form the connection points 131-132, where the connection points 131-132 may be implemented as coplanar feedlines or antenna elements to receive/emit differential signals (or the like), and patterned with any desired shape based on the antenna requirements. In another embodiment, each of the connection points 131-132 may be a signal trace implemented onto the second conductive layer 123 and coupled to the signal TMVs 111-112, respectively, where the connection points 131-132 may be substantially coplanar to the second conductive layer 123, and the connection points 131-132 may be isolated from the grounded portion(s) of the second conductive layer 123 with the openings(s) (or a second portion) of the cavity region 126. In some embodiments, the cavity region 126 may have a first portion (or region) covered with the connection points 131-132, the signal TMVs 111-112, and the encapsulation layer 140, while a second portion (or region) of the cavity region 126 may not be covered and exposed to air (or the like), and the second portion of the cavity region 126 may expose the bottommost surface of the first conductive layer 117 (or the bottom wall of the conductive cavity 127).

Alternatively, in one embodiment, the semiconductor package may implement different paths to route and emit the differential signals through the encapsulation layer of the conductive cavity antenna. For example, a combination of a signal TSV and a signal TMV may be implemented to route and emit the differential signals by directing the signals via the combination of the TMV and the TSV to the connection points, where the TSV may be disposed through the transceiver front-end die and the conductive cavity, and extend vertically from the transceiver front-end die to the connection point(s).

Furthermore, in alternate embodiments, two or more conductive cavity antennas may be implemented together into one package as a conductive cavity antenna array by disposing such antennas adjacently to each other (or side-by-side) over the conductive layer and the substrate. Note that these two or more antennas may be disposed side-by-side when the footprint (or the area) of a first conductive layer and a die (or the die backside metallization) are large enough to accommodate both of these antennas. In other alternate embodiments, the sidewalls of the conductive cavity of the conductive cavity antenna may be alternatively implemented with laser-grooved trenches filled in the encapsulation layer, where the laser-grooved trenches may be formed by etching one or more openings (or portions/trenches) in the encapsulation layer and then respectively sputtering/plating a conductive material into the etched openings (or the non-filled portions) to form the sidewalls of the conductive cavity of the conductive cavity antenna. Additionally, in an alternate embodiment, the sidewalls described herein may be omitted completely, and thus the conductive cavity 127 may be patterned/shaped based on the opening of the cavity region 126 without needing such sidewalls.

Moreover, in other alternate embodiments, the semiconductor packages described herein may implement a thin or ultra-thin conductive cavity (or a conductive cavity with a substantially low thickness/depth) to form the conductive cavity antenna, where the conductive cavity may be disposed into the topside of such packages (e.g., the thin conductive cavity may be disposed onto the topmost backside tape of the substrate of such packages).

Note that the semiconductor package 100 may include fewer or additional or alternative packaging components based on the desired packaging design.

Figure 2:
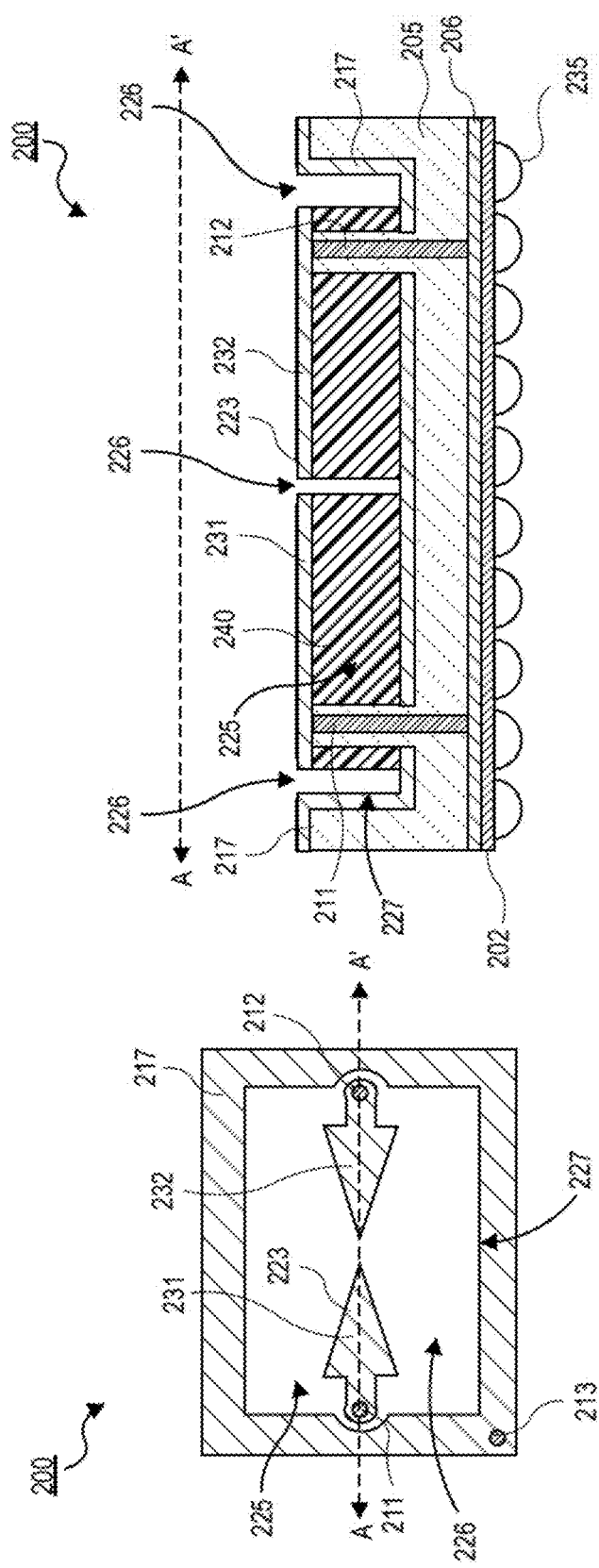
FIG. 2 are illustrations of a cross-sectional view and the respective plan view of a semiconductor package having a conductive cavity antenna, a first dielectric layer, a second dielectric layer, a first conductive layer, a second conductive layer, and a substrate, according to one embodiment.

FIG. 2 is a cross-sectional view and the respective plan view of a semiconductor package 200 as illustrated on the A-A', according to one embodiment. The semiconductor package 200 may be similar to the semiconductor package 100 described above in FIG. 1, with the exception that the conductive cavity antenna 225 is filled with a second dielectric layer 240 as compared to an encapsulation/mold layer, and disposed over a first dielectric layer 205 (e.g., a bulk silicon layer or the like) as compared to a die (i.e., the conductive cavity antenna 225 is formed over the bulk silicon wafer). In some embodiments, FIG. 2 illustrates one of the approaches that enables integrating the conductive cavity antenna 225 over a wafer substrate, such as a substrate 202 (or a substrate) of the semiconductor package 200.

In some embodiments, FIG. 2 illustrates one of the approaches that enables integrating the conductive cavity antenna 225 with the first conductive layer 217 to form a conductive cavity 227 (e.g., as opposed to a conductive cavity 127 of FIG. 1) with a cavity region 226 over a wafer substrate, such as a substrate 202 (or a substrate) of the semiconductor package 200, thereby providing a shorter path/connection from the front-end of the semiconductor package 200 to the conductive cavity antenna 225 that leads to a substantially minimized loss on this connection. Additionally, note that the second dielectric layer 240 may be disposed only below the connection points 231-232 within the cavity region 226, while the other portions of the cavity region 226 may remain open and filled with air (or the like) and may expose portions of the top surface of the first conductive layer 217, according to some embodiments.

Referring now to FIG. 2, a cross-sectional view and the respective plan view of a semiconductor package 200 is shown, in accordance with an embodiment. In one embodiment, the semiconductor package 200 is a semiconductor package. The semiconductor package 200 may be a semiconductor package that has been singulated (or diced)—at the wafer level—from a plurality of other semiconductor packages contained within a wafer. For example, the wafer may be any suitable type of wafer such as a bulk silicon wafer, a silicon-on-insulator (SOI) wafer, an engineered substrate formed of one or more semiconductor materials (e.g., crystalline silicon, amorphous silicon, polysilicon, etc.), and/or the like. In addition, for some embodiments, the wafer may be full or ground down to a predetermined substrate thickness.

The semiconductor package 200 may include a conductive cavity antenna 225 that is disposed over a first dielectric layer 205, an active layer 206, and a substrate 202. The conductive cavity antenna 225 may be substantially similar to the conductive cavity antenna 125 described above in FIG. 1. As described above, the conductive cavity antenna 225 may include a conductive cavity 227, a cavity region 226, and a plurality of interconnects 211-213. In some embodiments, the conductive cavity antenna 225 may be implemented with the first conductive layer 217 to form the conductive cavity 227 that surrounds the cavity region 226. For one embodiment, the conductive cavity 227 provides the conductive layers needed for shielding of the conductive cavity antenna 225. Additionally, in one embodiment, the conductive cavity 227 may include a plurality of connection points 231-232 that are disposed over a second dielectric layer 240 and a plurality of signal TSVs 211-212, where the signal TSVs 211-212 may conductively couple the active layer 206 (or the transceiver front-end die layer) to the connection points 231-232 of the conductive cavity antenna 225 as feedlines for differential signals (or the like). Accordingly, in some embodiments, the first conductive layer 217 may be patterned and disposed over the first dielectric layer 205 to form the conductive cavity 227 in the shape of a conductive enclosure with a bottom wall and a plurality of sidewalls.

Accordingly, as shown in FIG. 1, the first conductive layer 217 may provide the bottom wall and the sidewalls, and a second conductive layer 223 may provide the top wall/edges as a ground layer (or a ground plane/lid), where the combination of these walls (i.e., the sidewalls, the top wall/edge, and the bottom wall) may respectively form the conductive cavity 227 that surrounds the cavity region 226 of the conductive cavity antenna 225. Accordingly, in one embodiment, the sidewalls of the conductive cavity 227 (or the conductive cage) may be implemented with the conductive sidewalls of the first conductive layer 217. While, in another embodiment, the sidewalls of the conductive cavity 227 may be implemented with a combination of TMV sidewalls, TSV sidewalls, and/or conductive walls/trenches. That is, as described above in some embodiments, the sidewalls of the conductive cavity 227 may include TMV sidewalls, TSV sidewalls, conductive/metallized sidewalls, conductive/metallized trenches, and/or a combination thereof. Additionally, in an alternate embodiment, the sidewalls described herein may be omitted completely, and thus the conductive cavity 227 may be patterned/shaped based on the opening of the cavity region 226 without needing such sidewalls.

In these embodiments, the conductive cavity antenna 225 may also include the signal TSVs 211-212 that route differential signals (or the like) from the active layer 206, which may be implemented as the transceiver front-end layer, to the connection points 231-232. The connection points 231-232 may be substantially similar to the connection points 131-132 described above in FIG. 1. For some embodiments, the connection points 231-232 may be a plurality of differential feedline connection points, and/or a plurality of planar conductive antenna signal structures, where such connection points 231-232 (or antenna structures) may be disposed/patterned into the first conductive layer 223 (or the topmost conductive layer disposed over the second dielectric layer 240), and may be used to receive/emit signals such as mm-waveguide signals. Additionally, as shown with the cross-section view of FIG. 1, the signal TSVs 211-212 may extend vertically through the first dielectric layer 205 and the second dielectric layer 240, where the signal TSVs 211-212 are surrounded by the first dielectric layer 205 as the signal TSVs 211-212 extend through the second dielectric layer 240. The first dielectric layer 205 may be a bulk silicon layer or the like, while the second dielectric layer 240 may include a dielectric filler material/layer, an encapsulation layer, air, and/or the like as such materials of the second dielectric layer 240 may serve as the mechanical dielectric carriers for the connection points 231-232. Note that, in these embodiments, the second dielectric layer 240 may include a dielectric filler material with a low relative permittivity to achieve a signal with a larger (or greater) bandwidth if desired. Similarly, in some alternative embodiments, the second dielectric layer 240 may extend beyond the footprint of the connection points 231-232 to partially or completely fill the cavity region 226. Additionally, in other alternative embodiments, the second dielectric layer 240 may not fully extend throughout the footprint of the connection points 231-232 (i.e., the cavity region 226 partially reaches below/beneath the connection points 231-232).

In some embodiments, the signal TSVs 211-212 may be coupled to the active layer 206 and the topside connection points 231-232 of the conductive cavity antenna 225, while a ground TSV 213 may be coupled to the active layer 206 (or a ground plane on the substrate 202) and the top surface of the first conductive layer 217. As described above, the signal TSVs 211-212 may extend vertically from the active layer 206 to the connection points 231-232, and through the second dielectric layer 240 in the conductive cavity 227 of the conductive cavity antenna 225, where the signals TSVs 211-212 may be surrounded by the first dielectric layer 205. In some embodiments, the first dielectric layer 205 may be a bulk silicon layer (or the like), while the second dielectric layer 240 may be a dielectric filler material/layer. Note that, in these embodiments, the second dielectric layer 240 may include a dielectric filler material with a low relative permittivity to achieve a signal with a larger (or greater) bandwidth if desired.

For one embodiment, the first dielectric layer 205 may be disposed over the active layer 206 and the substrate 202, where the active layer 206 is disposed directly over the substrate 202. In one embodiment, the substrate 202 may include, but is not limited to, a substrate, a package, a PCB, and a motherboard. In some embodiments, the substrate 202 may be a redistribution layer and/or a substrate of alternating dielectric and conductive routing layers, as are known in the art. In another embodiment, the substrate 202 may be a layer of dielectric material. In other embodiments, the substrate 202 may be a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB may also include one or more conductive layers that may include copper or metallic traces, lines, pads, vias, via pads, and/or planes. In one embodiment, the substrate 202 may be coupled to a plurality of solder balls 235 that may be used to couple the substrate 202 to another substrate.

Furthermore, as shown in FIG. 2, the first conductive layer 217 may be disposed over the top surface of the first dielectric layer 205 and the active layer 206, where the first conductive layer 217 may be implemented as the conductive cavity 227 of the conductive cavity antenna 225. For one embodiment, the active layer 206 may be an active region, a redistribution layer comprised of conductive interconnects (or bumps), an active conductive layer, or the like. In an embodiment, the active layer 206 may be implemented as a transceiver front-end layer. Accordingly, both the cavity region 226 and the bottommost surface of the conductive cavity 227 of the first conductive layer 217 may be positioned over the first dielectric layer 205 at the periphery of the die region.

In one embodiment, the second dielectric layer 240 may be disposed over a portion of the first conductive layer 217, the first dielectric layer 205, the active layer 206, and the substrate 202. The second dielectric layer 240 may surround the signal TSVs 211-212 and may fill the cavity region 226 over the first conductive layer 217, where the second dielectric layer 240 may fill the cavity region 226 at the portions below the connection points 231-232. For example, the second dielectric layer 240 may have a top surface that is substantially coplanar to the top surfaces of the signal TSVs 211-212. Accordingly, the connection points 231-232 may have a top surface that is substantially coplanar to a topmost surface of the first conductive layer 217, where such topmost surface of the first conductive layer 217 may be located at the top edges of the conductive cavity antenna 225, and directly below the topmost surface of the first dielectric layer 205. In one embodiment, the second dielectric layer 240 may be a dielectric with one or more filler materials. For some embodiments, the second dielectric layer 240 may be a high-k dielectric, a low-k dielectric, and/or air.

For some embodiments, the second dielectric layer 240 may include one or more dielectric materials having a high-Dk dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used in the second dielectric layer 240 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In other embodiments, the second dielectric layer 240 may be formed using dielectric materials having low-Dk dielectric materials. Examples of such dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and/or organosilicates, such as silsesquioxane, siloxane, or organosilicate glass. For some embodiments, the second dielectric layer 240 may include pores, air gaps, or air regions/portions to further reduce such dielectric constant.

For one embodiment, the signal and ground TSVs 211 and 213 may be copper interconnects, copper pillars, and/or any similar conductive via interconnects. In one embodiment, the signal TSV 211 may have a width that is substantially equal to a width of the signal TSV 212. For one embodiment, the signal TSVs 211-212 may have a width that is substantially equal to a width of the ground TSV 213. In alternate embodiments, the signal TSVs 211-212 may have a width that is different than a width of the ground TSV 213.

Additionally, for one embodiment, the signal TSV 211 may have a thickness that is substantially equal to a thickness of the signal TSV 212. For example, the signal TSVs 211-212 may have a thickness that is substantially equal to a thickness of the first dielectric layer 205, where such thickness of the first dielectric layer 205 may be defined from the active layer 206 to the topmost surface of the first conductive layer 217.

In some embodiments, the first conductive layer 217 may be a grounded layer (or a grounded plane/lid) by conductively coupling the first conductive layer 217 to the ground TSV 213. For one embodiment, the conductive cavity 227 may surround the cavity region 226 and the connection points 231-232 of the conductive cavity antenna 225. Additionally, unlike the conductive cavity and the cavity region of FIG. 1, the conductive cavity 227 may have dimensions (x, y, and z values) that are substantially equal to the dimensions of the cavity region 226, where the conductive cavity 227 may have a specified dimension based on the desired packaging design and/or applications. The dimensions of the conductive cavity 227 of the conductive cavity antenna 225 may include a length in the lateral direction that may defined by half the wavelength of such antenna ($\lambda/2$), and a thickness (or a depth) in the z-height direction that may be approximately 100 μm or greater, where the thickness (or the cavity depth) may be limited by the bandwidth of such antenna. In other embodiments, the conductive cavity 227 may have a thickness of approximately 20-100 μm (or greater) based on specified applications that may be operating at narrower bands (e.g., such specified (or alternate/special) applications may include proximity sensing). In one embodiment, the conductive cavity 227 may have a thickness of approximately 20 um to 1 mm, where the thickness of the conductive cavity 227 may be based on the desired dielectric carrier thickness and bandwidth of the conductive cavity antenna 225.

Additionally, the conductive cavity 227 may have a footprint defined by an x-y area of the conductive cavity 227 based on the desired wavelength(s) of the conductive cavity antenna 225. The conductive cavity 227 may have an antenna length (x) that may be approximately equal to half of the desired wavelength. The conductive cavity 227 may have an antenna length (y) that may be approximately equal to or less than half of the desired wavelength. Note that the tolerance ranges of the footprint may vary by roughly ±50%, but such footprint may be greater if desired. For example, for mobile packaging, the conductive cavity 227 may have a footprint (or an x-y) of approximately 0.2 mm to 1 cm. Whereas, for larger packages, the conductive cavity 227 may have a footprint (or an x-y) of approximately 0.2 mm to 10 cm, according to another embodiment.

As shown in FIG. 2, a portion of the second conductive layer 223 may be patterned over the second dielectric layer 240 and the cavity region 226 to form the connection points 231-232, where the connection points 231-232 may be patterned with any desired shape based on the antenna requirements. In another embodiment, each of the connection points 231-232 may be a signal trace implemented onto the portion of the first conductive layer 223 and coupled to the signal TMVs 211-212, respectively, where the connection points 231-232 may be substantially coplanar to the topmost surface of the first conductive layer 223, and the connection points 231-232 may be isolated from the grounded portion(s) of the first conductive layer 217 with the openings(s) (or a second portion) of the cavity region 226. In some embodiments, the cavity region 226 may have a first portion (or region) covered with the connection points 231-232, the signal TSVs 211-212, and the second dielectric layer 240, while a second portion (or region) of the cavity region 226 may not be covered and exposed to air (or the like), and the second portion of the cavity region 226 may expose the bottommost surface of the first conductive layer 217 (or the bottom wall of the conductive cavity 227).

Furthermore, in alternate embodiments, two or more the conductive cavity antenna 225 may be implemented together into one package as a conductive cavity antenna 225 array by disposing such antennas adjacently to each other (or side-by-side) over the conductive layer and the substrate. Note that these two or more antennas may be disposed side-by-side when the footprint (or the area) of a first conductive layer and/or a die area/periphery are large enough to accommodate both of these antennas.

Alternatively, in an embodiment, the semiconductor package may implement different paths to route the signal and to excite the standing waves into the cavity region of the conductive cavity of the conductive cavity antenna 225. For example, in this alternate embodiment, a through via (or a through-filler via, a through-silicon via, a through-cavity via, or the like) may be implemented through the second dielectric layer 240 in the cavity region 226 of the conductive cavity 227 to route the signal, where the through via may extend vertically from the first conductive layer 217 to the second conductive layer 223, where the through via may either be not in electrical contact with the first conductive layer 217 or be coupled to a pad (or the like) disposed in/on the first conductive layer 217 that is isolated from the ground plane and respectively coupled to the signal TSV 211, and where this signal TSV 211 may only extend vertically from the active layer 206 to the pad of the first conductive layer 217 (i.e., rather than the signal TSV described above which extends vertically from the active layer 206 to the second conductive layer 223).

Furthermore, in additional embodiments, the semiconductor packages described herein may implement a thin or ultra-thin conductive cavity (or a conductive cavity with a substantially low thickness/depth) to form the conductive cavity antenna 225, where the conductive cavity may be disposed into the topside of such packages (e.g., the thin conductive cavity may be disposed onto the topmost backside tape of the substrate of such packages).

Note that the semiconductor package 200 may include fewer or additional or alternative packaging components based on the desired packaging design.

FIGS. 3A-3E are illustrations of cross-sectional views and respective plan views of a process flow to form a semiconductor package 300 with a conductive cavity antenna 325, according to some embodiments. The process flow illustrated in FIGS. 3A-3E forms the semiconductor package 300 which is substantially similar to the semiconductor package 100 described above in FIG. 1. Accordingly, as described above, the process flow of semiconductor package 300 illustrates one of the approaches to integrate the conductive cavity antenna 325 over a substrate 302 by implementing a plurality of TMVs 317, a first conductive layer 307, and a second conductive layer 323 over a die 305 to form a conductive cavity 327 and a cavity region 326 of the conductive cavity antenna 325, according to some embodiments.

Figure 3A:
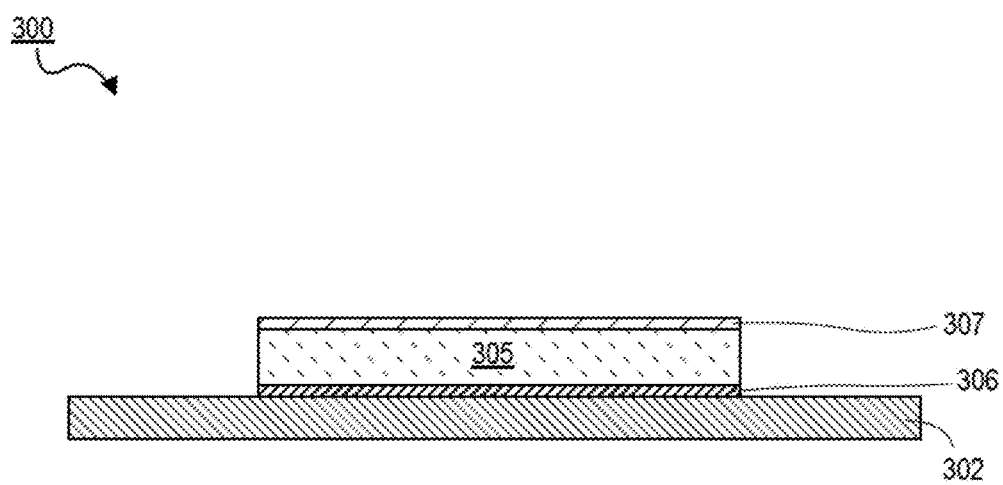

Referring now to FIG. 3A, a cross-sectional illustration of a semiconductor package 300 is shown, in accordance with an embodiment. In an embodiment, the semiconductor package 300 may include a die 305 disposed over an active layer 306 and a substrate 302, where the active layer 306 couples the substrate 302 to the die 305. The substrate 302, the die 305, and the active layer 306 are substantially similar to the substrate 102, the die 105, and the active layer 106 described above in FIG. 1. The active layer 306 may include a plurality of conductive bumps (or interconnects). For one embodiment, a first conductive layer 307 may be disposed over the top surface of the die 305.

Alternatively, in other embodiments, the semiconductor package 300 may be a wirebond package or the like. For example, in these alternative embodiments, the semiconductor package 300 may include a die (e.g., the die 305) disposed below an active layer (e.g., the active layer 306) and a substrate (e.g., the substrate 302), where the active layer may include a plurality of signal pads, and where a plurality of interconnects such as wirebonds or the like may be coupled from the substrate to the die and/or the active layer.

Figure 3B:
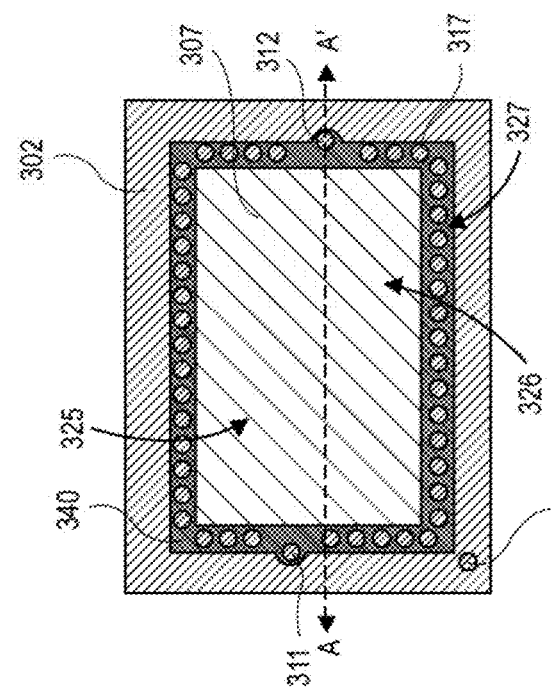
Figure 3B:
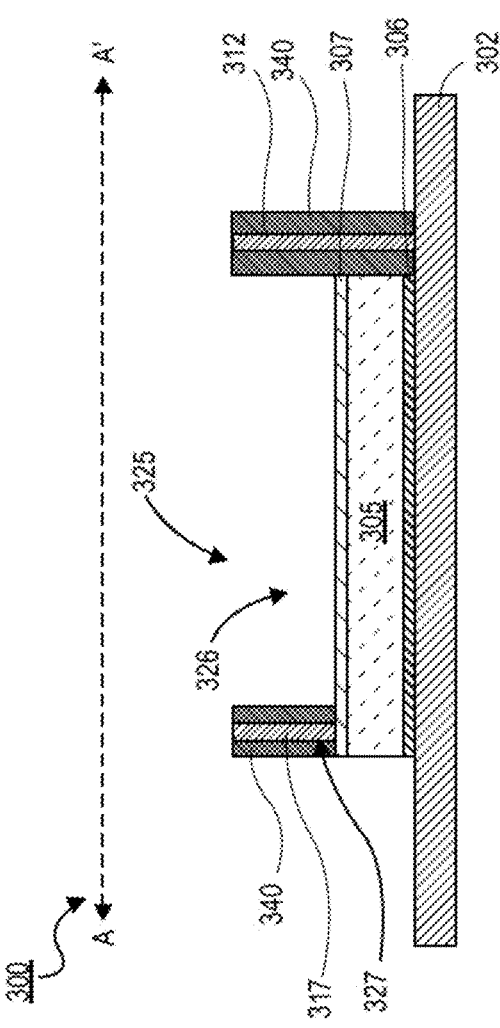

Referring now to FIG. 3B, a cross-sectional illustration and the respective plan illustration of a semiconductor package 300 on the A-A' axis is shown, in accordance with an embodiment. In an embodiment, the semiconductor package 300 may have a conductive cavity antenna 325 that includes a plurality of TMVs 317, a plurality of signal TMVs 311-312, and one or more ground TMVs 313. As shown in FIG. 3B, these TMVs 317 and 311-313 may be pre-encapsulated (or pre-molded) with an encapsulation layer 340, where the encapsulation layer 340 may surround each of the TMVs 317 and 311-313. The TMVs 317 and 311-313 are substantially similar to the TMVs 117 and 111-113 described above in FIG. 1. Note that, as described above, the conductive cavity 327 may additionally or alternatively be implemented with TMV sidewalls (e.g., such as the TMVs 317), TSV sidewalls, and/or conductive walls/trenches.

Additionally, in one embodiment, the TMVs 317 and the signal TMV 311 may be disposed directly over the first conductive layer 307, where the TMVs 317 are tightly positioned next to each other and above the first conductive layer 307 to form a conductive cavity 327 with a cavity region 326 (or an encaged cavity region). As shown with the top-view of FIG. 3B, the conductive cavity 327 may have the TMVs 317 and the cavity region 326 surround the signal TMVs 311-312, while the ground TMV 313 may be positioned outside the cavity region 326 of the conductive cavity 327. In one embodiment, the TMVs 317 and 311-313 with the encapsulation layer 340 may be implemented with a pick-and-place process or the like. In another embodiment, the TMVs 317 and 311-313 may be implemented a three-dimensional (3D) printing process, a lithographical process, a laser-drilled process, or the like, where the encapsulation layer 340 is initially disposed (or overmolded) over the substrate 302 and then the respective TMVs are implemented (or formed) (e.g., a complete filling and subsequent laser ablation/etching process or the like).

Figure 3C:
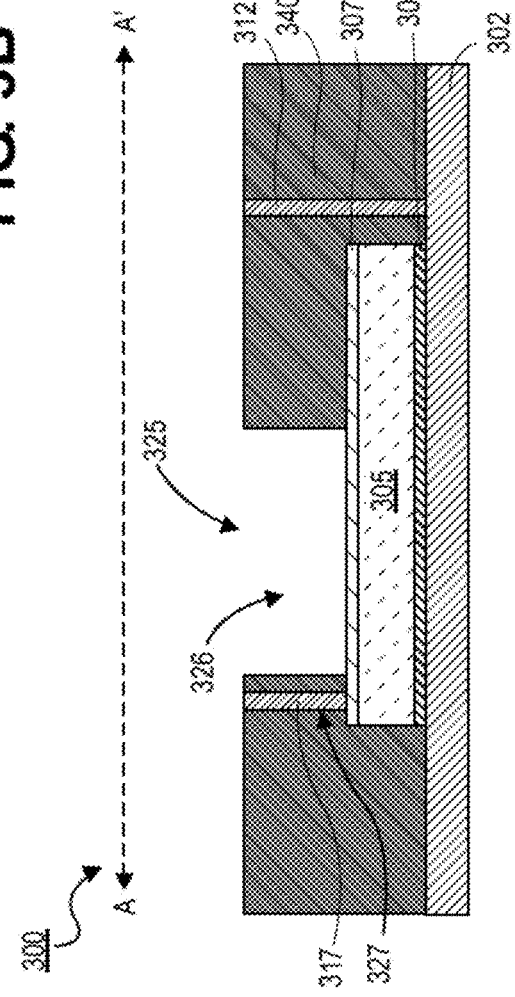

Referring now to FIG. 3C, a cross-sectional illustration and the respective plan illustration of a semiconductor package 300 on the A-A' axis is shown, in accordance with an embodiment. In an embodiment, the encapsulation layer 340 may be disposed (or deposited) (completely or partially) over the TMVs 317 and 311-313, the first conductive layer 307, the die 305, the active layer 306, and the substrate 302, where after the over-molding of the encapsulation layer 340, the cavity region 326 of the conductive cavity antenna 325 may remain exposed/unfilled, or portion(s) of the encapsulation layer 340 may be etched away after a complete deposition.

Additionally, a plurality of connection points 331-332 may be patterned over the encapsulation layer 340 and the cavity region 326 of the conductive cavity 327. The connection points 331-332 may be substantially similar to the connection points 131-132 described above in FIG. 1. In one embodiment, the encapsulation layer 340 may be implemented (over-molded) with an encapsulation/molding process or the like. Additionally, in another embodiment, the encapsulation layer 340 may be planarized with a polishing/grinding process or the like, thereby the encapsulation layer 340 may thus have a top surface that is substantially coplanar to the top surfaces of the TMVs 317 and 311-313. The encapsulation layer 340 is substantially similar to the encapsulation layer 140 described above in FIG. 1.

Referring now to FIG. 3D, a cross-sectional illustration and the respective plan illustration of a semiconductor package 300 with a conductive cavity antenna 325 is shown, in accordance with an embodiment. In an embodiment, the semiconductor package 300 may include a second conductive layer 323 disposed over the encapsulation layer 340, the TMVs 317 and 311-313, and the connection points 331-332 of the conductive cavity antenna 325. The second conductive layer 323 may be substantially similar to the second conductive layer 123 described above in FIG. 1. The second conductive layer 323 may be coupled to the top surfaces of the TMVs 317 and 311-313, where an opening(s) in the cavity region 326 may be patterned into the second conductive layer 323 to form the connection points 331-332 over the conductive cavity 327 to ensure isolation of the signal vias 311 and 312 from the grounded vias such as the TMVs 317 and the ground TMV 313.

In one embodiment, the connection points 331-332 of the second conductive layer 323 may be implemented by a masked sputtering process or the like. In some embodiments, the connection points 331-332 may be covered with portions (or the conductive material) of the second conductive layer 323. The connection points 331-332 may be differential signal connection points, feedlines, antenna elements, waveguide connectors, differential signal traces patterned into the second conductive layer 323, or the like, where the connection points 331-332 may be isolated from the grounded portion of the second conductive layer 323 and may be coupled to the feedlines of the signal TMVs 311-312 to receive/emit differential signals (or the like).

Referring now to FIG. 3E, a cross-sectional illustration of a semiconductor package 300 with a conductive cavity antenna 325 is shown, in accordance with an embodiment. In an embodiment, the semiconductor package 300 may include a plurality of solder balls 335. The solder balls 335 may be coupled to the substrate 302. Additionally, after the solder balls 335 are disposed, the semiconductor package 300 may be singulated from the other semiconductor packages.

Additionally, in other embodiments, an alternative process flow may be implemented to form a semiconductor package with a conductive cavity antenna and an encapsulation layer. The process flow to form this semiconductor package may be substantially similar to the semiconductor package 300 described above in FIGS. 3A-3E. Accordingly, the process flow of this semiconductor package illustrates one of the approaches to integrate the conductive cavity antenna over a substrate by implementing a plurality of TMVs, a first conductive layer, and a second conductive layer over a die to form a conductive cavity and a cavity region of the conductive cavity antenna, according to some embodiments.

For example, this semiconductor package may initially dispose (or couple/bond) the die on the substrate, where the first conductive layer and an active layer may respectively sandwich (or embed/surround) the die (e.g., as shown in FIG. 3A). The semiconductor package may then dispose (or encapsulate) the encapsulation layer over the first conductive layer, the die, and the substrate. Thereafter, in one embodiment, this semiconductor package may pattern the encapsulation layer to form openings of the TMVs over (or above) the first conductive layer and the substrate, where the openings of the TMVs may be formed with an etch process, a laser process, and/or the like. The semiconductor package may dispose a conductive material into the openings of the TMVs to form the metallized TMVs, and the second conductive layer over the top surfaces of the encapsulation layer and the TMVs, thereby forming the conductive cavity of the conductive cavity antenna. Moreover, in another embodiment, this semiconductor package may pattern the second conductive layer to form the connection points (e.g., such as the connection points 331-332 as shown in FIG. 3D) of the conductive cavity antenna, and to expose portions of the encapsulation layer that is positioned over the die, where the connection points of such antenna may be patterned using a photo-litho process, an etch process, and/or the like. Lastly, the semiconductor package may remove (or etch) the exposed encapsulation layer to form the cavity region of the conductive cavity antenna, where the cavity region may isolate the connection points (e.g., as shown in FIG. 3D) and expose the top surface of the first conductive layer over the die.

Note that the semiconductor package 300 of FIGS. 3A-3E may include fewer or additional or alternative packaging components based on the desired packaging design.

Figure 4A:
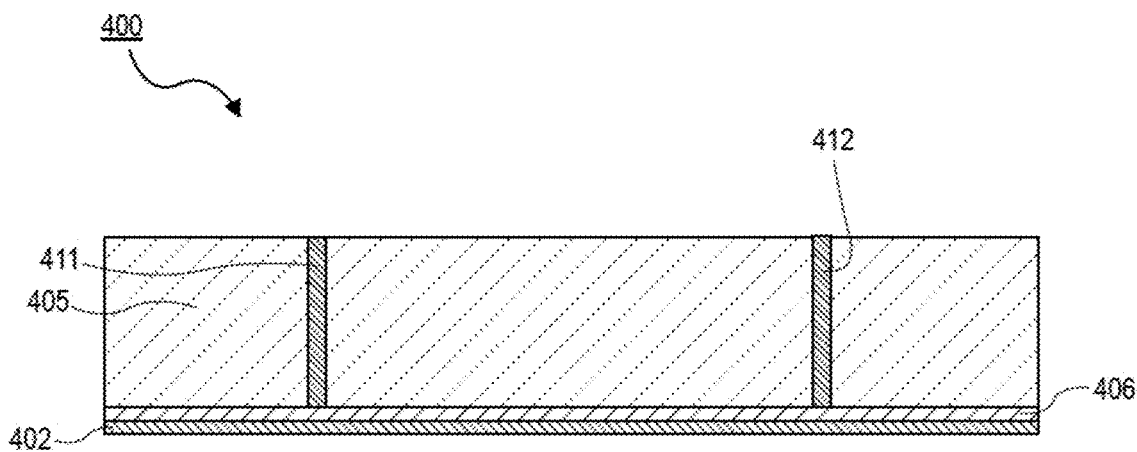
FIGS. 4A-4F are illustrations of cross-sectional views of a process flow to form a semiconductor package having a conductive cavity antenna, a first dielectric layer, a second dielectric layer, a first conductive layer, a second conductive layer, and a substrate, according to some embodiments.

Referring now to FIG. 4A, a cross-sectional illustration of a semiconductor package 400 is shown, in accordance with an embodiment. In an embodiment, the semiconductor package 400 may include a first dielectric layer 405 disposed over an active layer 406 and a substrate 402. For one embodiment, a plurality of signal TSVs 411-412 (and a ground TSV) are disposed through the first dielectric layer 405 and extend vertically on the active layer 406, where the first dielectric layer 405 may have a top surface that is substantially coplanar to top surfaces of the signal TSVs 411-412. The substrate 402, the first dielectric layer 405, the signal TSVs 411-412, and the active layer 406 are substantially similar to the substrate 202, the first dielectric layer 205, the signal TSVs 211-212, and the active layer 206 described above in FIG. 2. The active layer 406 may be implemented as a transceiver front-end that is coupled to the signal TSVs 411-412, where the signal TSVs 411-412 may be used as feedlines for differential signals to one or more connection points as subsequently described below.

Figure 4B:
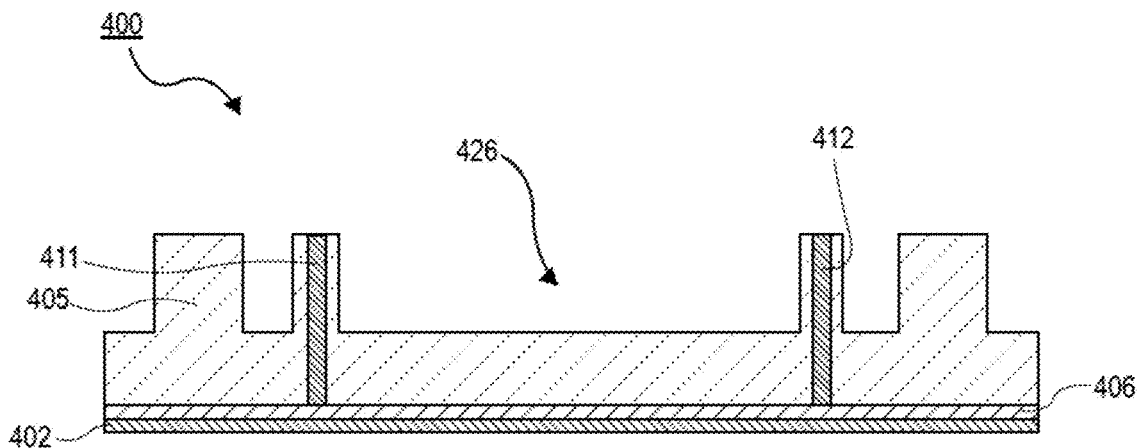

Referring now to FIG. 4B, a cross-sectional illustration of a semiconductor package 400 is shown, in accordance with an embodiment. In an embodiment, the semiconductor package 400 may include patterning the first dielectric layer 405 to form a plurality of openings into the first dielectric layer 405, including a cavity region(s) 426 that surrounds the signal TSVs 411-412. For one embodiment, the cavity region 426 and the other openings may be masked-etched cavities, where the first dielectric layer 405 (or the bulk silicon layer) disposed at the die periphery and around the signal TSVs 411-412 still remains. Additionally, the signal TSVs 411-412 may be etched to include a top surface that is substantially coplanar to a top surface of the first dielectric layer 405. In one embodiment, the cavity region 426 and the other openings may be implemented with a reactive-ion etching process or the like.

Figure 4C:
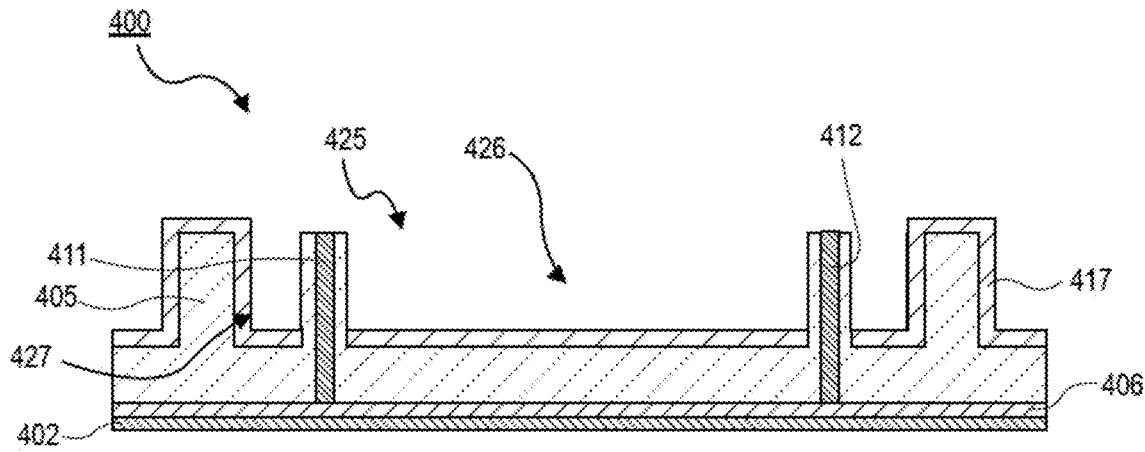

Referring now to FIG. 4C, a cross-sectional illustration of a semiconductor package 400 is shown, in accordance with an embodiment. In an embodiment, the semiconductor package 400 may include a first conductive layer 417. The first conductive layer 417 may be disposed over the first dielectric layer 405 and the cavity region 426 of the conductive cavity 427, where the signal TSVs 411-412 remain isolated and surrounded with the first dielectric layer 405, and thus not coupled to the first conductive layer 417. The first conductive layer 417 may be substantially similar to the first conductive layer 217 described above in FIG. 2. In one embodiment, as described above, the first conductive layer 417 may be patterned with the cavity region 426 to form the conductive cavity 427 of the conductive cavity antenna 425, where the conductive cavity 427 may thus be implemented as the conductive enclosure/cage with a bottom wall and a plurality of sidewalls of the conductive cavity antenna 425. Furthermore, the first conductive surface 417 may be directly coupled to a top surface of a ground TSV (e.g., as shown with the ground TSV 213 of FIG. 2), and may include a top surface that is substantially coplanar to top surfaces of the signal TSVs 411-412, where the sidewalls and top surfaces of the signal TSVs 411-412 may remain isolated as the signal TSVs 411-412 are surrounded (or embedded/covered) with the first dielectric layer 405 and thus not coupled to the first conductive layer 417. Also, note that unlike the sidewalls of the conductive cavity 427, the patterned sidewalls of the first dielectric 405 disposed around the TSVs 411-412 need to remain uncovered by the first conductive layer 417.

Figure 4D:
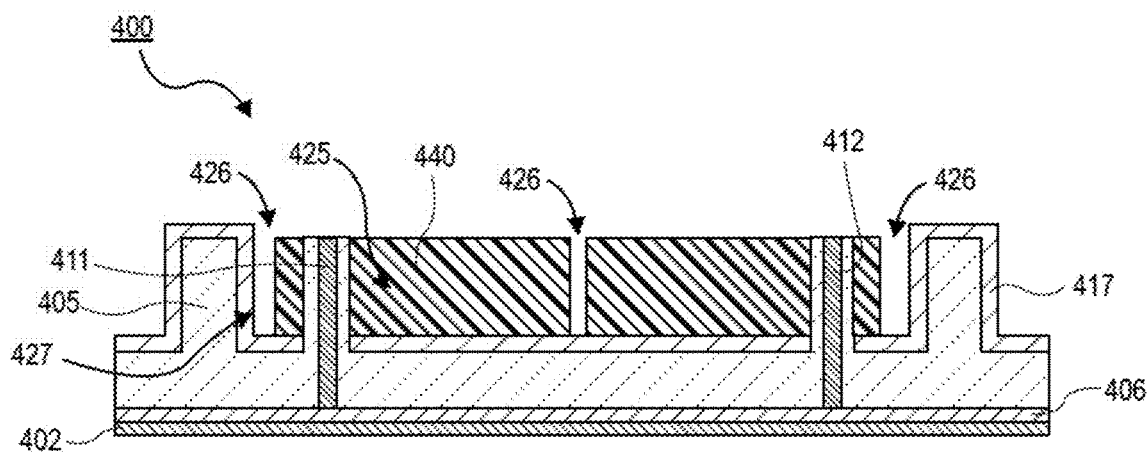

Referring now to FIG. 4D, a cross-sectional illustration of a semiconductor package 400 is shown, in accordance with an embodiment. In an embodiment, the semiconductor package 400 may include a second dielectric layer 440. The second dielectric layer 440 may be disposed into a portion of the cavity region 426 of the conductive cavity 427 and over the first conductive layer 417, where the second dielectric layer 440 may surround the signal TSVs 411-412 that are surrounded with the first dielectric layer 405. The second dielectric layer 440 may be substantially similar to the second dielectric layer 240 described above in FIG. 2. In one embodiment, the second dielectric layer 440 may have a top surface that is substantially coplanar to top surfaces of the signal TSVs 411-412 and the first dielectric layer 405. In one embodiment, the second dielectric layer 440 may be implemented with a filler dispensing process, a 3D/screen printing process, or the like.

Figure 4E:
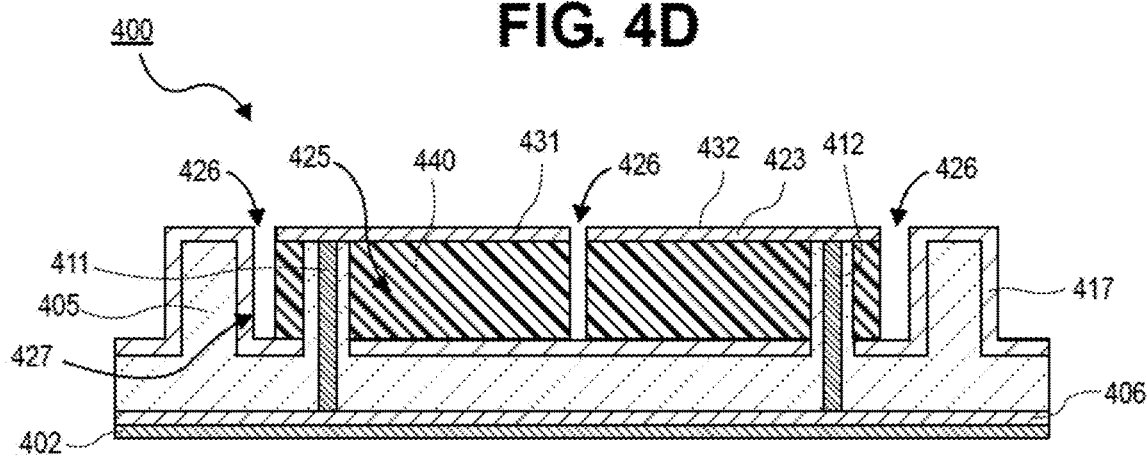

Referring now to FIG. 4E, a cross-sectional illustration of a semiconductor package 400 is shown, in accordance with an embodiment. In an embodiment, the semiconductor package 400 may include a second conductive layer 423 disposed over the second dielectric layer 440, the signal TSVs 411-412 surrounded with the first dielectric layer 405, and the first conductive layer 417. For one embodiment, a plurality of connection points 431-432 may be patterned into the second conductive layer 423. The connection points 431-432 may be substantially similar to the connection points 231-232 described above in FIG. 2. In one embodiment, the connection points 431-432 may be coupled to the top surfaces of the signal TMVs 411-412. The connection points 431-432 may be differential signal connection points, feedlines, antenna elements, waveguide connectors, differential signal traces patterned into the second conductive layer 423, where the connection points 431-432 may be coupled to the feedlines of the signal TMVs 411-412 to receive/emit differential signals (or the like). In one embodiment, the connection points 431-432 may be implemented by a masked sputtering process or the like.

Figure 4F:
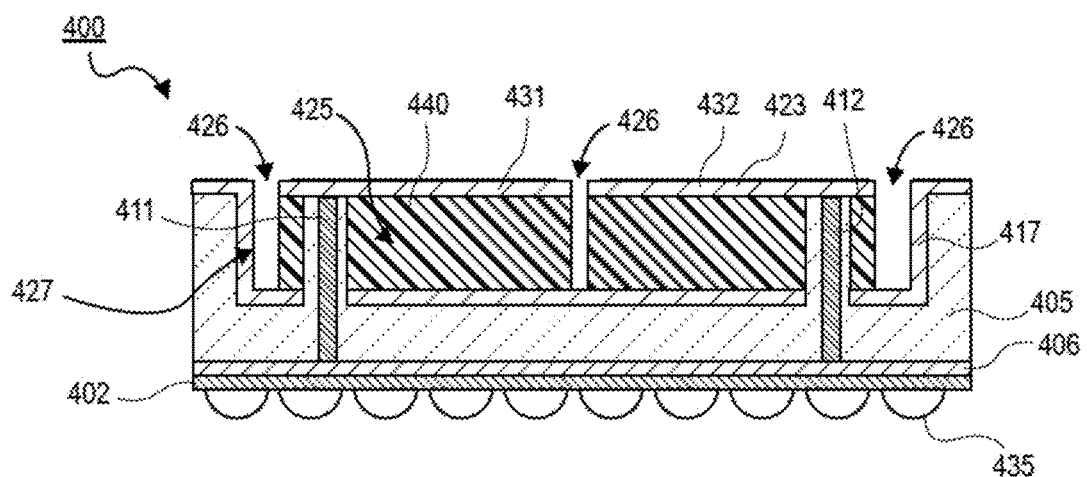

Referring now to FIG. 4F, a cross-sectional illustration of a semiconductor package 400 with a conductive cavity antenna 425 is shown, in accordance with an embodiment. In an embodiment, the semiconductor package 400 may include a plurality of solder balls 435. The solder balls 435 may be coupled to the substrate 402. Additionally, after the solder balls 435 are disposed, the semiconductor package 400 may be singulated from the other semiconductor packages on the wafer.

Note that the semiconductor package 400 of FIGS. 4A-4F may include fewer or additional or alternative packaging components based on the desired packaging design.

Figure 5:
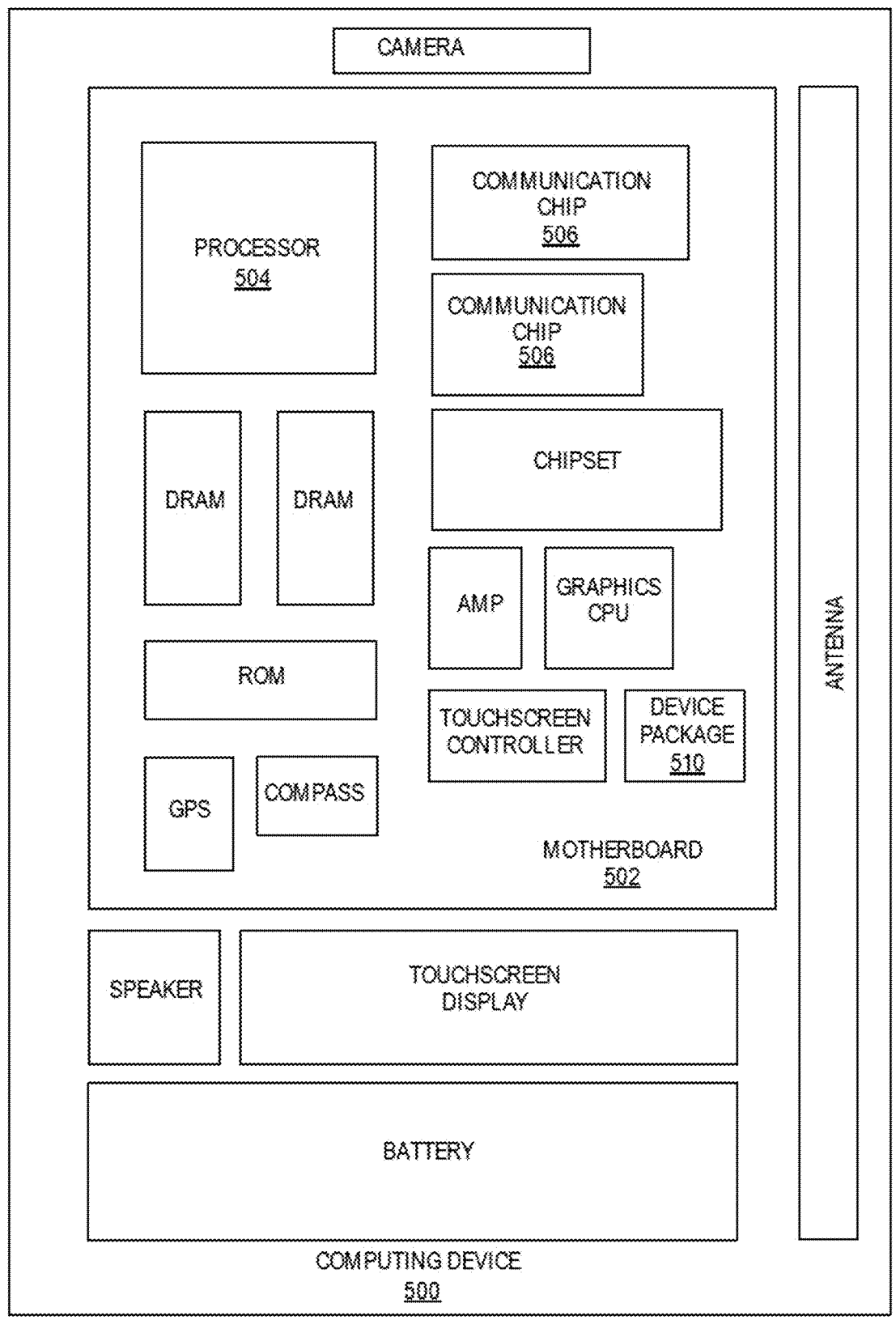
FIG. 5 is an illustration of a schematic block diagram illustrating a computer system that utilizes a device package having one or more conductive cavity antennas, according to one embodiment.

FIG. 5 is an illustration of a schematic block diagram illustrating a computer system 500 that utilizes a device package 510 (or a semiconductor package) with a cavity resonator antenna (and/or a cavity resonator antenna), according to one embodiment. FIG. 5 illustrates an example of computing device 500. Computing device 500 houses motherboard 502. For one embodiment, motherboard 502 may be similar to the substrates 100 and 200 of FIGS. 1-2. Motherboard 502 may include a number of components, including but not limited to processor 504, device package 510, and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a semiconductor package such as a WLCSP, a FCP, a wirebond encapsulated package, or the like as described above. In particular, device package 510 may be a semiconductor package that includes a cavity resonator antenna as described herein, where such antenna may be disposed over a conductive layer, a die (or a bulk silicon layer, etc.), and a substrate as described herein, and where such antenna (or antenna array) may include a plurality of components as described and illustrated in FIGS. 1-4F—or any other components from the figures described herein (i.e., such antenna may include components from FIGS. 1 and 2 and any other embodiments as described herein).

Note that device package 510 may be a single component/device, a subset of components, and/or an entire system, as the materials, features, and components may be limited to device package 510 and/or any other component of the computing device 500 that may need a package integrated cavity resonator antenna as described herein (e.g., the motherboard 502, the processor 504, and/or any other component of the computing device 500 that may need such antennas as described herein).

For certain embodiments, the integrated circuit die may be packaged with one or more devices on a substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a die over a substrate; a first conductive layer over the die; a conductive cavity antenna over the first conductive layer and the substrate, wherein the conductive cavity antenna includes a conductive cavity, a cavity region, and a plurality of interconnects, wherein the conductive cavity is over a top surface of the first conductive layer, and wherein the conductive cavity surrounds the cavity region; and a second conductive layer over the conductive cavity antenna, the first conductive layer, and the substrate, wherein the conductive cavity extends vertically from the first conductive layer to the second conductive layer, and wherein the cavity region is embedded with the conductive cavity, the first conductive layer, and the second conductive layer.

In example 2, the subject matter of example 1 can optionally include that the plurality of interconnects include a plurality of first interconnects, a plurality of second interconnects, and a third interconnect, wherein the plurality of first interconnects include a plurality of TMVs, a plurality of TSVs, a plurality of conductive sidewalls, or a plurality of conductive trenches, wherein the plurality of first interconnects extend vertically from the first conductive layer to the second conductive layer, wherein the plurality of first interconnects are on the top surface of the first conductive layer, and wherein the plurality of first interconnects surround the cavity region.

In example 3, the subject matter of examples 1-2 can optionally include an active layer on the substrate, wherein the active layer is between the die and the substrate, and wherein the active layer couples the die to the substrate; an encapsulation layer over and around the conductive cavity antenna, the first conductive layer, the die, the active layer, and the substrate, wherein the encapsulation layer surrounds the plurality of first interconnects, the plurality of second interconnects, and the third interconnect, and wherein the encapsulation layer is in the cavity region of the conductive cavity of the conductive cavity antenna; and a plurality of solder balls coupled to the substrate.

In example 4, the subject matter of examples 1-3 can optionally include that the conductive cavity includes a top wall, a bottom wall, and a plurality of sidewalls, wherein the top wall includes a surface of the second conductive layer, wherein the bottom wall includes a surface of the first conductive layer, and wherein the plurality of sidewalls include the plurality of first interconnects.

In example 5, the subject matter of example 1 can optionally include that a plurality of conductive cavity antennas disposed over the top surface of the first conductive layer, wherein the plurality of conductive cavity antennas are coupled to the conductive cavity antenna.

In example 6, the subject matter of examples 1-4 can optionally include that the conductive cavity antenna further includes a plurality of connection points, wherein the plurality of connection points are over the encapsulation layer, the first conductive layer, the plurality of second interconnects, and the substrate, wherein the cavity region has a first portion covered with the plurality of connection points, the plurality of second interconnects, and the encapsulation layer, wherein the cavity region has a second portion that is not covered and exposed to air, wherein the second portion exposes the top surface of the first conductive layer, wherein the plurality of connection points are a plurality of differential signal feedlines, wherein the plurality of connection points are completely surrounded with the second portion of the cavity region, wherein the plurality of connection points have a top surface that is substantially coplanar to a top surface of the second conductive layer, and wherein the plurality of connection points are conductively coupled to the plurality of second interconnects.

In example 7, the subject matter of example 6 can optionally include that the plurality of connection points include a first connection point and a second connection point, wherein the first connection point has a shape that is the same as a shape of the second connection point, and wherein the first connection point is positioned adjacently to the second connection point within the cavity region.

In example 8, the subject matter of example 7 can optionally include that each of the plurality of second interconnects and the third interconnect is a TMV, wherein the plurality of second interconnects include a first signal TMV and a second signal TMV, wherein the third interconnect is a ground TMV, wherein the first signal TMV extends vertically from the substrate to the first connection point, wherein the second signal TMV extends vertically from the substrate to the second connection point, wherein the ground TMV is on the substrate and extends vertically from the substrate to the second conductive layer, wherein the ground TMV is positioned outside the conductive cavity, wherein the plurality of first interconnects and the ground TMV are conductively coupled to the second conductive layer, wherein the first and second connection points are isolated from the second conductive layer with the second portion of the cavity region, and wherein the first signal TMV has a thickness that is substantially equal to a thickness of the second signal TMV and a thickness of the ground TMV.

In example 9, the subject matter of example 8 can optionally include wherein, when the plurality of first interconnects include the plurality of TMVs, the plurality of TMVs are tightly positioned on a plurality of outer edges of the top surface of the first conductive layer, wherein, when the plurality of first interconnects include the plurality of TMVs, the plurality of TMVs are separated with a plurality of gaps, wherein each gap is between two of the plurality of TMVs, wherein, when the plurality of first interconnects include the plurality of TMVs, the plurality of TMVs have a width that is substantially equal to a width of the plurality of gaps, and wherein, when the plurality of first interconnects include the plurality of TMVs, plurality of TMVs have a thickness that is less than the thicknesses of the first and second signal TMVs.

Example 10 is a semiconductor package, comprising: a first dielectric layer over an active layer and a substrate, wherein the active layer is on the substrate; a first conductive layer over the first dielectric layer; a conductive cavity antenna over the first conductive layer, the first dielectric layer, and the substrate, wherein the conductive cavity antenna includes a conductive cavity, a cavity region, and a plurality of interconnects, wherein the conductive cavity is over the first dielectric layer, wherein the plurality of interconnects are on the active layer, and wherein the conductive cavity surrounds the cavity region; and a second conductive layer over the conductive cavity antenna, the first conductive layer, and the first dielectric layer, wherein the cavity region is embedded with the conductive cavity, the first conductive layer, and the second conductive layer, and wherein the first conductive layer has a top surface that is substantially coplanar to a top surface of the second conductive layer.

In example 11, the subject matter of example 10 can optionally include that the plurality of interconnects include a plurality of first interconnects and a second interconnect, wherein the plurality of first interconnects extend vertically from the active layer to the second conductive layer, wherein the plurality of first interconnects are surrounded with the first dielectric layer and the cavity region, wherein the first dielectric layer is a bulk silicon layer, wherein the first dielectric layer has a top surface that is substantially coplanar to a top surface of the plurality of first interconnects, and wherein the second conductive layer is on the top surfaces of the first dielectric layer and the plurality of first interconnects.

In example 12, the subject matter of examples 10-11 can optionally include a second dielectric layer over and around the conductive cavity antenna, the plurality of first interconnects, the first dielectric layer, and the first conductive layer, wherein the second dielectric layer surrounds the plurality of first interconnects and the first dielectric layer, and wherein the second dielectric layer is in the cavity region of the conductive cavity of the cavity resonator antenna; and a plurality of solder balls coupled to the substrate.

In example 13, the subject matter of examples 10-12 can optionally include that the conductive cavity includes a top wall, a bottom wall, and a plurality of sidewalls, wherein the top wall includes a surface of the second conductive layer, wherein the bottom wall includes a bottom surface of the first conductive layer that is opposite to the top surface of the first conductive layer, wherein the plurality of sidewalls include a surface of the first conductive layer, and wherein the plurality of sidewalls include a plurality of TSVs, a plurality of TMVs, a plurality of conductive sidewalls, or a plurality of conductive trenches.

In example 14, the subject matter of example 10 can optionally include a plurality of conductive cavity antennas disposed over the first conductive layer, the first dielectric layer, and the substrate, wherein the plurality of conductive cavity antennas are coupled to the conductive cavity antenna.

In example 15, the subject matter of examples 10-13 can optionally include that wherein the conductive cavity antenna further include a plurality of connection points, wherein the plurality of connection points are over the second dielectric layer, the first dielectric layer, the plurality of first interconnects, and the substrate, wherein the cavity region has a first portion covered with the plurality of connection points, the plurality of first interconnects, and the first and second dielectric layers, wherein the cavity region has a second portion that is not covered and exposed to air, wherein the second portion exposes the bottom surface of the first conductive layer, wherein the plurality of connection points are a plurality of differential signal feedlines, wherein the plurality of connection points are completely surrounded with the second portion of the cavity region, wherein the plurality of connection points have a top surface that is substantially coplanar to the top surface of the first conductive layer, and wherein the plurality of connection points are conductively coupled to the plurality of first interconnects.

In example 16, the subject matter of example 15 can optionally include that the plurality of connection points include a first connection point and a second connection point, wherein the first connection point has a shape that is the same as a shape of the second connection point, and wherein the first connection point is positioned adjacently to the second connection point within the cavity region.

In example 17, the subject matter of example 16 can optionally include that each of the plurality of first interconnects and the second interconnect is a TMV, wherein the plurality of first interconnects include a first signal TMV and a second signal TMV, wherein the second interconnect is a ground TMV, wherein the bottom wall of the conductive cavity includes a plurality of openings, wherein the first and second signal TSVs are embedded vertically within the first dielectric layer, wherein the first and second signal TSVs extend vertically through the first dielectric layer, the second dielectric layer, and the plurality of openings of the conductive cavity, wherein the ground TMV is on the substrate and extends vertically from the substrate to the top surface of the first conductive layer, wherein the ground TMV is positioned outside the conductive cavity, wherein the ground TMV is conductively coupled to the first conductive layer, wherein the first and second connection points are isolated from the first conductive layer with the second portion of the cavity region, and wherein the first signal TMV has a thickness that is substantially equal to a thickness of the second signal TMV and a thickness of the ground TMV.

Example 18 is a method of forming a semiconductor package, comprising: disposing a die region over a substrate; disposing a first conductive layer over a top surface of the die region; disposing a conductive cavity over a top surface of the first conductive layer, wherein the conductive cavity surrounds a cavity region; and disposing a second conductive layer over the conductive cavity, the cavity region, the first conductive layer, and the substrate, wherein the conductive cavity extends vertically from the first conductive layer to the second conductive layer, wherein the cavity region is embedded with the conductive cavity, the first conductive layer, and the second conductive layer to form a conductive cavity antenna, wherein the conductive cavity antenna is over the first conductive layer and the substrate, and wherein the conductive cavity antenna includes the conductive cavity, the cavity region, and a plurality of interconnects.

In example 19, the subject matter of example 18 can optionally include that the plurality of interconnects include a plurality of first interconnects, a plurality of second interconnects, and a third interconnect, wherein the plurality of first interconnects include a plurality of TMVs, a plurality of TSVs, a plurality of conductive sidewalls, or a plurality of conductive trenches, wherein the plurality of first interconnects extend vertically from the first conductive layer to the second conductive layer, wherein the plurality of first interconnects are on the top surface of the first conductive layer, and wherein the plurality of first interconnects surround the cavity region.

In example 20, the subject matter of examples 18-19 can optionally include disposing an active layer on the substrate, wherein the active layer is between the die region and the substrate, and wherein the active layer couples the die region to the substrate; disposing an encapsulation layer over and around the conductive cavity antenna, the first conductive layer, the die region, the active layer, and the substrate, wherein the encapsulation layer surrounds the plurality of first interconnects, the plurality of second interconnects, and the third interconnect, wherein the encapsulation layer is in the cavity region of the conductive cavity of the conductive cavity antenna, wherein the die region includes a die or a first dielectric layer, wherein the encapsulation layer includes a mold layer or a second dielectric layer, and wherein the first dielectric layer is a bulk silicon layer; and disposing a plurality of solder balls coupled to the substrate.

In example 21, the subject matter of examples 18-20 can optionally include that the conductive cavity includes a top wall, a bottom wall, and a plurality of sidewalls, wherein the top wall includes a surface of the second conductive layer, wherein the bottom wall includes a surface of the first conductive layer, and wherein the plurality of sidewalls include the plurality of first interconnects.

In example 22, the subject matter of example 18 can optionally include disposing a plurality of conductive cavity antennas disposed over the top surface of the first conductive layer, wherein the plurality of conductive cavity antennas are coupled to the conductive cavity antenna.

In example 23, the subject matter of examples 18-21 can optionally include that the conductive cavity antenna further includes a plurality of connection points of the second conductive layer, wherein the plurality of connection points are over the encapsulation layer, the first conductive layer, the plurality of second interconnects, and the substrate, wherein the cavity region has a first portion covered with the plurality of connection points, the plurality of second interconnects, and the encapsulation layer, wherein the cavity region has a second portion that is not covered and exposed to air, wherein the second portion exposes the top surface of the first conductive layer, wherein the plurality of connection points are a plurality of differential signal feedlines, wherein the plurality of connection points are completely surrounded with the second portion of the cavity region, wherein the plurality of connection points have a top surface that is substantially coplanar to a top surface of the second conductive layer, wherein the plurality of connection points are conductively coupled to the plurality of second interconnects, wherein the plurality of connection points include a first connection point and a second connection point, wherein the first connection point has a shape that is the same as a shape of the second connection point, and wherein the first connection point is positioned adjacently to the second connection point within the cavity region.

In example 24, the subject matter of example 23 can optionally include that the plurality of second interconnects include a first signal interconnect and a second signal interconnect, wherein the third interconnect is a ground interconnect, wherein the first signal interconnect extends vertically from the substrate to the first connection point, wherein the second signal interconnect extends vertically from the substrate to the second connection point, wherein the ground interconnect is on the substrate and extends vertically from the substrate to the second conductive layer, wherein the ground interconnect is positioned outside the conductive cavity, wherein the plurality of first interconnects and the ground interconnect are conductively coupled to the second conductive layer, wherein the first and second connection points are isolated from the second conductive layer with the second portion of the cavity region, and wherein the first signal interconnect has a thickness that is substantially equal to a thickness of the second signal interconnect and a thickness of the ground interconnect.

In example 25, the subject matter of example 24 can optionally include that wherein, when the plurality of first interconnects include the plurality of TMVs, the plurality of TMVs are tightly positioned on a plurality of outer edges of the top surface of the first conductive layer, wherein, when the plurality of first interconnects include the plurality of TMVs, the plurality of TMVs are separated with a plurality of gaps, wherein, when the plurality of first interconnects include the plurality of TMVs, each gap is between two of the plurality of TMVs, wherein, when the plurality of first interconnects include the plurality of TMVs, the plurality of TMVs have a width that is substantially equal to a width of the plurality of gaps, and wherein, when the plurality of first interconnects include the plurality of TMVs, the plurality of TMVs have a thickness that is less than the thicknesses of the first and second signal interconnects.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A semiconductor package, comprising:
a die over a substrate;
a first conductive layer over the die;
an antenna over the first conductive layer and the substrate, wherein the antenna includes a conductive cavity, a cavity region, and a plurality of interconnects that extend to a top of the cavity region, the plurality of interconnects comprising a first plurality of discrete interconnects along a first side of the conductive cavity, and a second plurality of discrete interconnects along a second, different, side of the conductive cavity, wherein the conductive cavity is over a top surface of the first conductive layer, and wherein the conductive cavity surrounds the cavity region; and a second conductive layer over the antenna, the first conductive layer, and the substrate, wherein the conductive cavity extends vertically from the first conductive layer to the second conductive layer, and wherein the cavity region is embedded with the conductive cavity, the first conductive layer, and the second conductive layer.

2. The semiconductor package of claim 1, wherein the plurality of interconnects include a plurality of first interconnects, a plurality of second interconnects, and a third interconnect.

3. The semiconductor package of claim 2, further comprising:

an active layer on the substrate, wherein the active layer is between the die and the substrate, and wherein the active layer couples the die to the substrate;

an encapsulation layer over and around the antenna, the first conductive layer, the die, the active layer, and the substrate, wherein the encapsulation layer surrounds the plurality of first interconnects, the plurality of second interconnects, and the third interconnect, wherein the encapsulation layer is in the cavity region of the conductive cavity of the antenna; and a plurality of solder balls coupled to the substrate.

4. The semiconductor package of claim 3, wherein the conductive cavity includes a top wall, a bottom wall, or a plurality of sidewalls, wherein the top wall includes a surface of the second conductive layer, and wherein the bottom wall includes a surface of the first conductive layer.

5. The semiconductor package of claim 4, wherein the antenna further includes a plurality of connection points of the second conductive layer, wherein the plurality of connection points are over the encapsulation layer, the first conductive layer, the plurality of second interconnects, and the substrate, wherein the cavity region has a first portion covered with the plurality of connection points, the plurality of second interconnects, and the encapsulation layer, wherein the plurality of connection points are a plurality of differential signal feedlines, wherein the plurality of connection points have a top surface that is substantially coplanar to a top surface of the second conductive layer, wherein the plurality of connection points are conductively coupled to the plurality of second interconnects, wherein the plurality of connection points include a first connection point and a second connection point, and wherein the first connection point is positioned adjacently to the second connection point within the cavity region.

6. The semiconductor package of claim 5, wherein each of the plurality of second interconnects and the third interconnect is a through-mold vias (TMV), wherein the plurality of second interconnects include a first signal TMV and a second signal TMV, wherein the third interconnect is a ground TMV, wherein the first signal TMV extends vertically from the substrate to the first connection point, wherein the second signal TMV extends vertically from the substrate to the second connection point, wherein the ground TMV is on the substrate and extends vertically from the substrate to the second conductive layer, wherein the ground TMV is positioned outside the conductive cavity, wherein the plurality of TMVs and the ground TMV are conductively coupled to the second conductive layer, wherein the first and second connection points are isolated from the second conductive layer with the second portion of the cavity region and wherein the first signal TMV has a thickness that is substantially equal to a thickness of the second signal TMV and a thickness of the ground TMV.

7. The semiconductor package of claim 6, wherein the plurality of TMVs are tightly positioned on a plurality of outer edges of the top surface of the first conductive layer, wherein the plurality of TMVs are separated with a plurality of gaps, wherein each gap is between two of the plurality of TMVs, wherein the plurality of TMVs have a width that is substantially equal to a width of the plurality of gaps, and wherein plurality of TMVs have a thickness that is less than the thicknesses of the first and second signal TMVs.

8. The semiconductor package of claim 7, wherein the plurality of first interconnects include a plurality of TMVs, a plurality of through-silicon vias (TSVs), a plurality of conductive sidewalls, or a plurality of conductive trenches, wherein the plurality of first interconnects extend vertically from the first conductive layer to the second conductive layer, wherein the plurality of first interconnects are on the top surface of the first conductive layer, wherein the plurality of first interconnects surround the cavity region, wherein the plurality of sidewalls include the plurality of first interconnects, wherein the cavity region has a second portion that is not covered and exposed to air, wherein the second portion exposes the top surface of the first conductive layer, or wherein the plurality of connection points are completely surrounded with second portion of the cavity region.

9. The semiconductor package of claim 1, further comprising a plurality of antennas disposed over the top surface of the first conductive layer, wherein the plurality of antennas are coupled to the antenna.

10. A semiconductor package, comprising:

a die over a substrate;

a first conductive layer over the die;

an antenna over the first conductive layer and the substrate, wherein the antenna includes a conductive cavity, a cavity region, and a plurality of interconnects, wherein the conductive cavity is over a top surface of the first conductive layer, and wherein the conductive cavity surrounds the cavity region, wherein the plurality of interconnects include a plurality of first interconnects, a plurality of second interconnects, and a third interconnect;

a second conductive layer over the antenna, the first conductive layer, and the substrate, wherein the conductive cavity extends vertically from the first conductive layer to the second conductive layer, and wherein the cavity region is embedded with the conductive cavity, the first conductive layer, and the second conductive layer;

an active layer on the substrate, wherein the active layer is between the die and the substrate, and wherein the active layer couples the die to the substrate;

an encapsulation layer over and around the antenna, the first conductive layer, the die, the active layer, and the substrate, wherein the encapsulation layer surrounds the plurality of first interconnects, the plurality of second interconnects, and the third interconnect, wherein the encapsulation layer is in the cavity region of the conductive cavity of the antenna; and a plurality of solder balls coupled to the substrate.

11. The semiconductor package of claim 10, wherein the conductive cavity includes a top wall, a bottom wall, or a plurality of sidewalls, wherein the top wall includes a surface of the second conductive layer, and wherein the bottom wall includes a surface of the first conductive layer.

12. The semiconductor package of claim 11, wherein the antenna further includes a plurality of connection points of the second conductive layer, wherein the plurality of connection points are over the encapsulation layer, the first conductive layer, the plurality of second interconnects, and the substrate, wherein the cavity region has a first portion covered with the plurality of connection points, the plurality of second interconnects, and the encapsulation layer, wherein the plurality of connection points are a plurality of differential signal feedlines, wherein the plurality of connection points have a top surface that is substantially coplanar to a top surface of the second conductive layer, wherein the plurality of connection points are conductively coupled to the plurality of second interconnects, wherein the plurality of connection points include a first connection point and a second connection point, and wherein the first connection point is positioned adjacently to the second connection point within the cavity region.

13. The semiconductor package of claim 12, wherein each of the plurality of second interconnects and the third interconnect is a through-mold vias (TMV), wherein the plurality of second interconnects include a first signal TMV and a second signal TMV, wherein the third interconnect is a ground TMV, wherein the first signal TMV extends vertically from the substrate to the first connection point, wherein the second signal TMV extends vertically from the substrate to the second connection point, wherein the ground TMV is on the substrate and extends vertically from the substrate to the second conductive layer, wherein the ground TMV is positioned outside the conductive cavity, wherein the plurality of TMVs and the ground TMV are conductively coupled to the second conductive layer, wherein the first and second connection points are isolated from the second conductive layer with the second portion of the cavity region, and wherein the first signal TMV has a thickness that is substantially equal to a thickness of the second signal TMV and a thickness of the ground TMV.

14. The semiconductor package of claim 13, wherein the plurality of TMVs are tightly positioned on a plurality of outer edges of the top surface of the first conductive layer, wherein the plurality of TMVs are separated with a plurality of gaps, wherein each gap is between two of the plurality of TMVs, wherein the plurality of TMVs have a width that is substantially equal to a width of the plurality of gaps, and wherein plurality of TMVs have a thickness that is less than the thicknesses of the first and second signal TMVs.

15. The semiconductor package of claim 14, wherein the plurality of first interconnects include a plurality of TMVs, a plurality of through-silicon vias (TSVs), a plurality of conductive sidewalls, or a plurality of conductive trenches, wherein the plurality of first interconnects extend vertically from the first conductive layer to the second conductive layer, wherein the plurality of first interconnects are on the top surface of the first conductive layer, wherein the plurality of first interconnects surround the cavity region, wherein the plurality of sidewalls include the plurality of first interconnects, wherein the cavity region has a second portion that is not covered and exposed to air, wherein the second portion exposes the top surface of the first conductive layer, or wherein the plurality of connection points are completely surrounded with second portion of the cavity region.

* * * * *